(12) United States Patent
Yano et al.

(10) Patent No.: US 10,821,483 B2
(45) Date of Patent: Nov. 3, 2020

(54) SUBSTRATE TREATMENT APPARATUS

(71) Applicant: SCREEN Holdings Co., Ltd., Kyoto (JP)

(72) Inventors: Wataru Yano, Kyoto (JP); Akio Hashizume, Kyoto (JP)

(73) Assignee: SCREEN Holdings Co., Ltd., Kyoto (JP)

(*) Notice: Subject to any disclaimer, the term of this patent is extended or adjusted under 35 U.S.C. 154(b) by 419 days.

(21) Appl. No.: 15/692,018

(22) Filed: Sep. 13, 2017

(65) Prior Publication Data

US 2018/0078973 A1 Mar. 22, 2018

(30) Foreign Application Priority Data

Sep. 21, 2016 (JP) .................................. 2016-183919

(51) Int. Cl.
*B08B 1/04* (2006.01)
*H01L 21/02* (2006.01)
(Continued)

(52) U.S. Cl.
CPC .............. *B08B 1/04* (2013.01); *A46B 5/0025* (2013.01); *A46B 9/005* (2013.01); *A46B 13/04* (2013.01);
(Continued)

(58) Field of Classification Search
CPC ........... B08B 1/04; B08B 1/002; B08B 1/007; B08B 3/08; A46B 5/0025; A46B 9/005;
(Continued)

(56) References Cited

U.S. PATENT DOCUMENTS

| 5,778,969 A | 7/1998 | Kyung et al. ................ 165/80.1 |
| 5,860,181 A | 1/1999 | Maekawa et al. |

(Continued)

FOREIGN PATENT DOCUMENTS

| JP | H5-326474 A | 12/1993 |
| JP | H09-92633 A | 4/1997 |

(Continued)

OTHER PUBLICATIONS

Notice of Reasons for Refusal dated Mar. 24, 2020 in counterpart Japanese Patent Application No. 2016-183919 and English translation obtained from Global Dossier.

*Primary Examiner* — Joseph J Hail
*Assistant Examiner* — J Stephen Taylor
(74) *Attorney, Agent, or Firm* — Ostrolenk Faber LLP

(57) ABSTRACT

A substrate treatment apparatus includes a brush moving mechanism which moves a shaft to which a cleaning brush is attached. The brush body includes a substrate contact portion of a pillar-shaped portion. The substrate treatment apparatus further includes a correcting member and a relatively-positioning mechanism. When the correcting member is placed in a target position, a contact portion of the correcting member overlaps an object portion which is a combination of a design contact portion and a belt-shaped annular portion in an outer surface of a design pillar-shaped portion of a design body of a design brush. The contact portion is formed to have an inverted shape of the object portion of the design brush, and a portion of the contact portion, which corresponds to the belt-shaped annular portion, is a center-axis facing surface which faces a center axis of the shaft.

14 Claims, 20 Drawing Sheets

(51) Int. Cl.
*A46B 5/00* (2006.01)
*A46B 9/00* (2006.01)
*A46B 13/04* (2006.01)
*A46B 15/00* (2006.01)
*B08B 1/00* (2006.01)
*B08B 3/08* (2006.01)
*H01L 21/67* (2006.01)
*H01L 21/687* (2006.01)

(52) U.S. Cl.
CPC .......... *A46B 15/0004* (2013.01); *B08B 1/002* (2013.01); *B08B 1/007* (2013.01); *B08B 3/08* (2013.01); *H01L 21/67046* (2013.01); *H01L 21/68764* (2013.01); *A46B 2200/30* (2013.01)

(58) Field of Classification Search
CPC . A46B 13/04; A46B 15/0004; A46B 2200/30; H01L 21/67046; H01L 21/68764
See application file for complete search history.

(56) References Cited

U.S. PATENT DOCUMENTS

| | | | |
|---|---|---|---|
| 6,175,983 B1 * | 1/2001 | Hirose | B08B 1/007 15/102 |
| 6,379,469 B1 * | 4/2002 | Tanaka | B08B 1/007 134/6 |
| 6,412,134 B1 | 7/2002 | Oikawa | |
| 8,051,522 B2 * | 11/2011 | Nakano | H01L 21/67046 15/77 |
| 2005/0208774 A1 | 9/2005 | Fukunaga et al. | 438/745 |
| 2006/0060138 A1 | 3/2006 | Keller et al. | 118/715 |
| 2008/0289652 A1 | 11/2008 | Hamada | |
| 2009/0095219 A1 | 4/2009 | Meinhold et al. | 118/708 |
| 2009/0313776 A1 | 12/2009 | Mouri et al. | 15/88.2 |
| 2017/0250096 A1 * | 8/2017 | Wang | H01L 21/67046 |

FOREIGN PATENT DOCUMENTS

| | | | |
|---|---|---|---|
| JP | H10-209094 A | | 8/1998 |
| JP | 2000-173966 A | | 6/2000 |
| JP | 2002-222788 | | 8/2002 |
| JP | 2008-515171 | | 5/2008 |
| JP | 2009130122 A | * | 6/2009 |
| JP | 2009140961 A | * | 6/2009 |
| JP | 2009-164405 A | | 7/2009 |
| JP | 2009164405 A | * | 7/2009 |
| JP | 2009-206358 A | | 9/2009 |
| JP | 2009212119 A | * | 9/2009 |
| JP | 2010-003739 | | 1/2010 |
| JP | 2015-019024 | | 1/2015 |

\* cited by examiner

FIG. 10
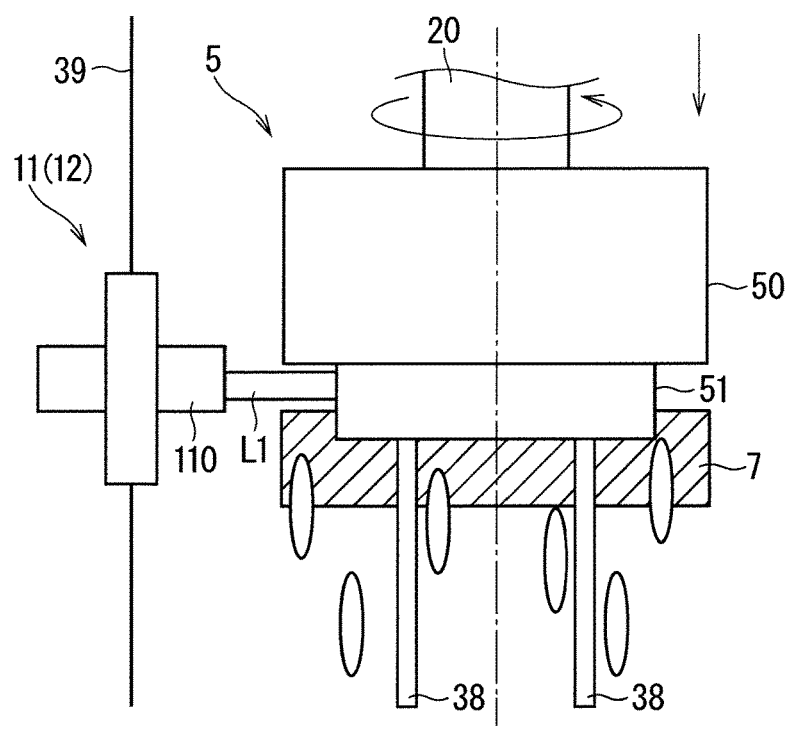
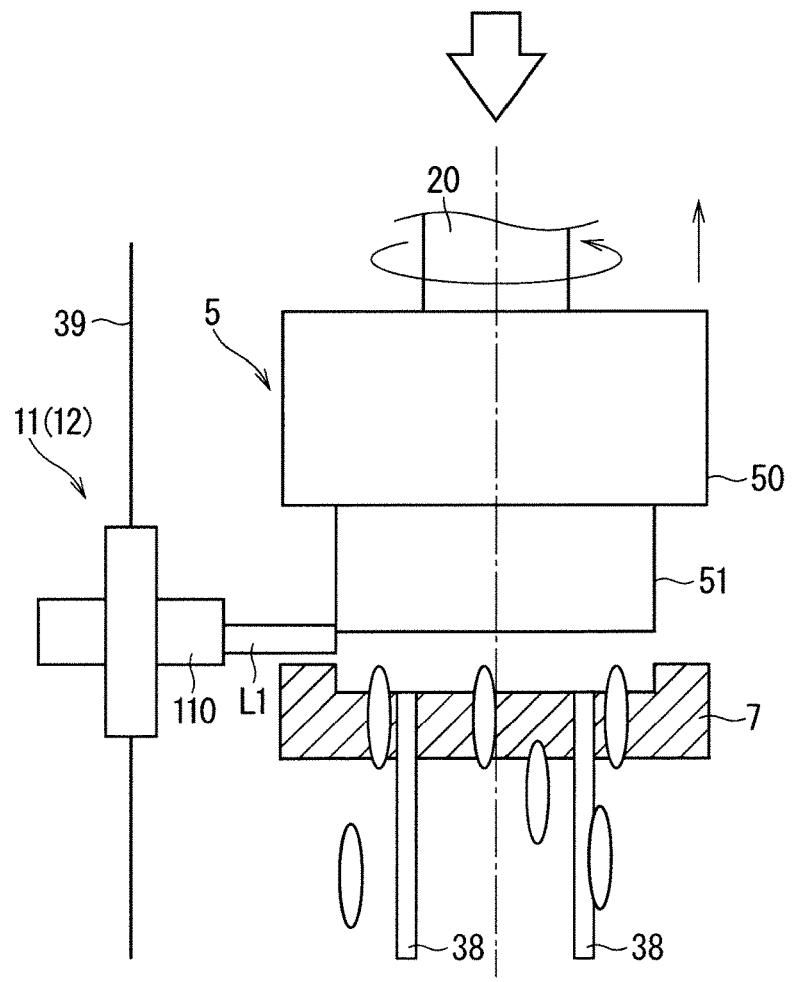

F I G. 1 1
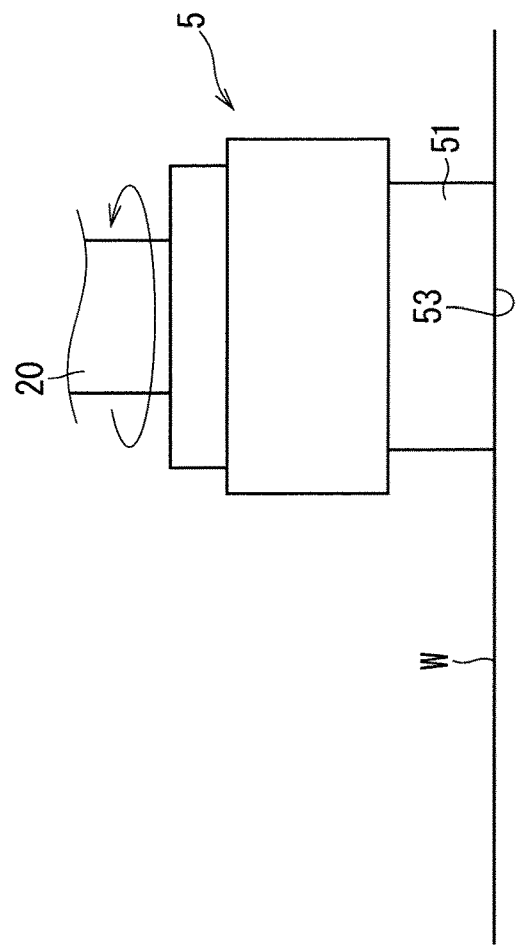
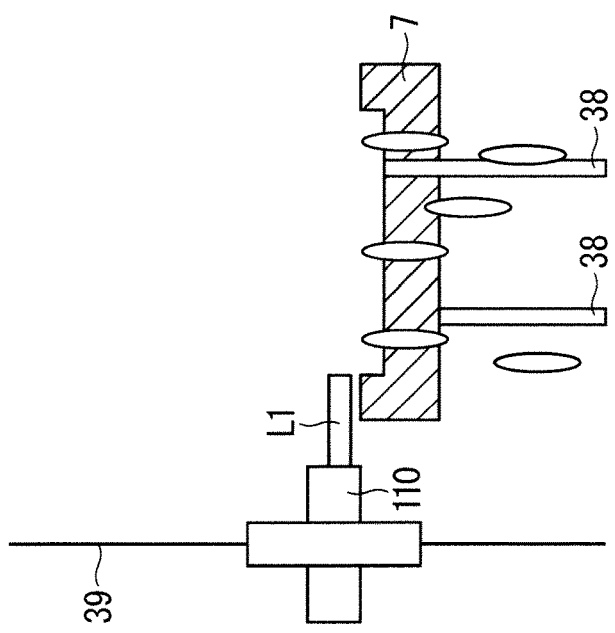

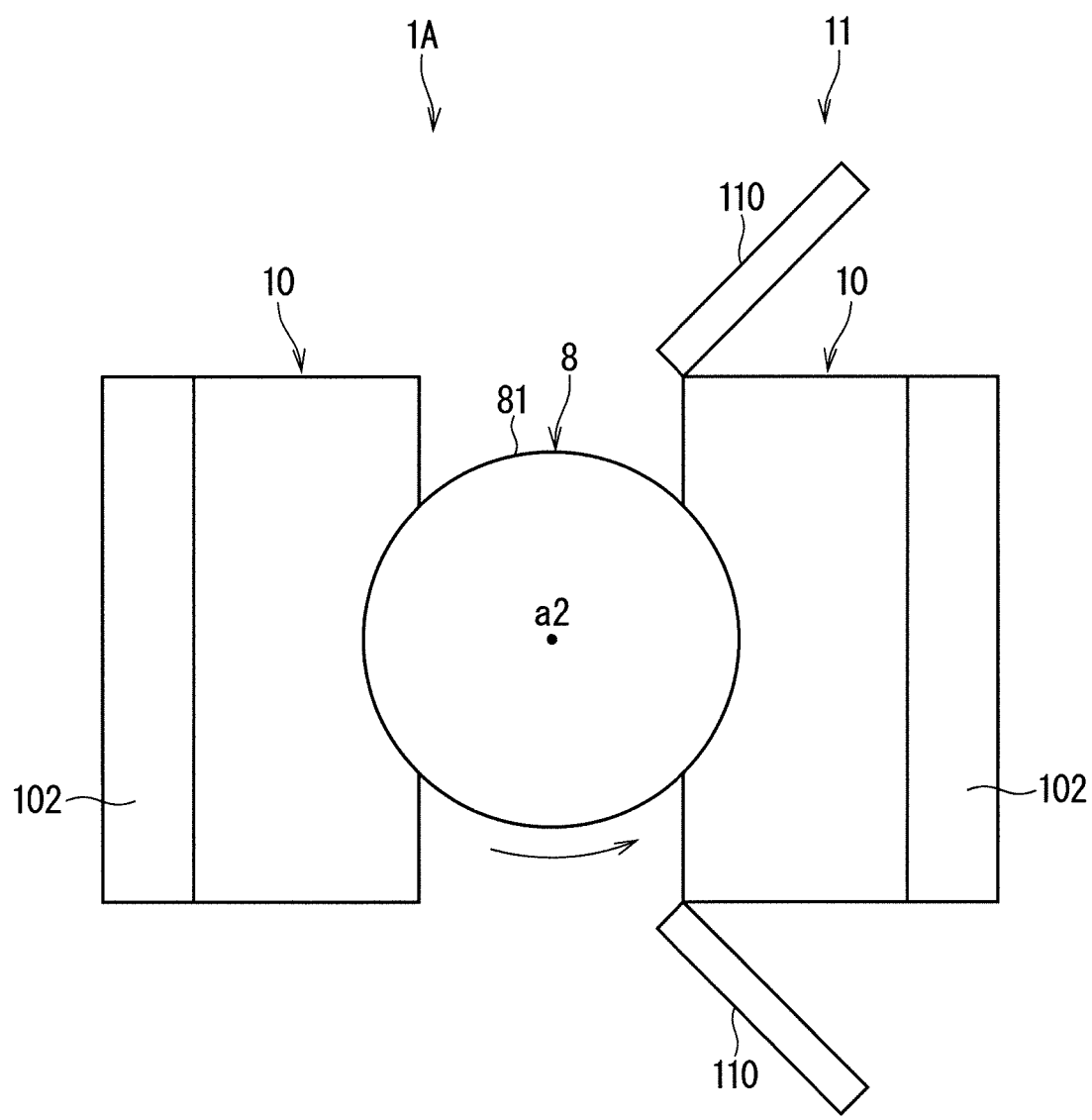
F I G. 2 2

SUBSTRATE TREATMENT APPARATUS

BACKGROUND OF THE INVENTION

Field of the Invention

The present invention relates to a substrate treatment apparatus which brings a brush into contact with surfaces of various types of substrates, and performs a cleaning process. Various types of substrates include a semiconductor wafer, a glass substrate for a liquid crystal display, a glass substrate for a plasma display, a substrate for an optical disk, a substrate for a magnetic disk, a substrate for a magneto-optical disk, a glass substrate for a photomask, a substrate for a solar cell, and the like.

Description of the Background Art

Japanese Patent Application Laid-Open No. 2015-19024 describes a substrate treatment apparatus which performs a cleaning process on an upper surface of a substrate. The substrate treatment apparatus includes an arm which is movable upward and downward and is rotatable about a predetermined rotation axis in a horizontal plane. At an end of the arm, a shaft extending downward is provided so as to be rotatable about a center axis thereof. A cleaning brush including a brush body attached to a brush holder is connected to a lower end of the shaft. The substrate treatment apparatus rotates the arm while feeding a treatment liquid for cleaning to an upper surface of a substrate with the cleaning brush being pressed against an upper surface of the substrate being rotating, to thereby move the cleaning brush between a central portion of an upper surface of the substrate and an edge of an upper surface of the substrate. Then, the brush body of the cleaning brush comes into contact with a whole of an upper surface of the substrate, and a cleaning process is performed on an upper surface of the substrate. When a cleaning process of the substrate is finished, the surface treatment apparatus moves the arm, to thereby move the cleaning brush to a standby pod which has a tubular shape and is provided in a standby position. In the standby pod, a cleaning bar which has a tubular shape and discharges a cleaning liquid used for cleaning the cleaning brush is provided. The substrate treatment apparatus rotate the shaft and the cleaning brush about a center axis integrally with each other with the brush body of the cleaning brush being pressed against the cleaning bar, so that the brush body can be cleaned.

However, in the substrate treatment apparatus described in Japanese Patent Application Laid-Open No. 2015-19024, after repetition of cleaning processes of a substrate, the brush body of the cleaning brush would deform, so that a size of a substrate contact portion which is a portion of the brush body, which comes into contact with a substrate, varies, and thus, a manner in which the brush body comes into contact with a substrate varies. As a result of this, a substrate cannot be cleaned in an expected manner, which would lead to problems of reduction in efficiency in cleaning and an increased possibility of soiling a substrate.

SUMMARY OF THE INVENTION

The present invention is directed to a substrate treatment apparatus.

A substrate treatment apparatus in one aspect of the present invention includes: a rotary holding mechanism configured to hold a substrate and rotate the substrate about a predetermined rotation axis; a cleaning brush including a brush body which is elastically deformable; and a brush moving mechanism including a shaft to which the cleaning brush is attached, the shaft extending in a direction transverse to a main surface of the substrate, and the brush moving mechanism being configured to move the cleaning brush by moving the shaft, wherein the brush body includes a pillar-shaped portion extending in a direction in which the shaft extends, and includes a substrate contact portion which forms an end surface of the pillar-shaped portion and is configured to come into contact with the substrate, the brush moving mechanism is capable of bringing the substrate contact portion of the brush body into contact with the main surface of the substrate, a design brush is defined by a virtual cleaning brush which has a design shape of the cleaning brush and is attached to the shaft in a predetermined manner, a design body is defined by a portion of the design brush, which corresponds to the brush body, and a design contact portion is defined by a portion of the design body, which corresponds to the substrate contact portion. The substrate treatment apparatus further includes: a correcting member including, in an outer surface, a contact portion which faces and is allowed to come into contact with an outer surface of the design body of the design brush; and a relatively-positioning mechanism configured to place the correcting member in a target position determined relatively to the design brush by moving the correcting member relatively to the design brush, wherein when the correcting member is placed in the target position, the contact portion overlaps an object portion which is a combination of the design contact portion in an outer surface of a design pillar-shaped portion of the design body, which corresponds to the pillar-shaped portion, and a belt-shaped annular portion extending from an outer edge of the design contact portion in a direction in which the shaft extends, in the outer surface, and the contact portion is formed to have an inverted shape of the object portion of the design brush, and a portion of the contact portion, which corresponds to the belt-shaped annular portion, is a center-axis facing surface which faces a center axis of the shaft.

In this apparatus, the brush body of the cleaning brush includes the substrate contact portion which forms an end surface of the pillar-shaped portion extending in a direction in which the shaft extends. The design brush has a design shape of the cleaning brush. The object portion is a combination of the design contact portion corresponding to the substrate contact portion in an outer surface of the design brush, and the belt-shaped annular portion extending from an outer edge of the design contact portion in a direction in which the shaft extends. Then, when the correcting member is placed in a target position, the contact portion of the correcting member overlaps the object portion. The contact portion is formed to have an inverted shape of the object portion, and a portion of the contact portion, which corresponds to the belt-shaped annular portion, is the center-axis facing surface which faces the center axis of the shaft. Accordingly, when the correcting member is placed in a target position, the substrate contact portion of the cleaning brush is restrained from expanding by the center-axis facing surface of the correcting member. As a result of this, variation in size of the substrate contact portion can be reduced.

A substrate treatment apparatus in another aspect of the present invention includes: a rotary holding mechanism configured to hold a substrate and rotate the substrate about a predetermined rotation axis; a cleaning brush including a brush body which is elastically deformable; and a brush moving mechanism including a shaft to which the cleaning brush is attached, the shaft extending in a direction transverse to a main surface of the substrate, and the brush moving mechanism being configured to move the cleaning brush by moving the shaft, wherein the brush body includes a pillar-shaped portion extending in a direction in which the shaft extends, and includes a substrate contact portion which forms an end surface of the pillar-shaped portion and is configured to come into contact with the substrate, the brush moving mechanism is capable of bringing the substrate contact portion of the brush body into contact with the main surface of the substrate, a design brush is defined by a virtual cleaning brush which has a design shape of the cleaning brush and is attached to the shaft in a predetermined manner, a design body is defined by a portion of the design brush, which corresponds to the brush body, and a design contact portion is defined by a portion of the design body, which corresponds to the substrate contact portion. The substrate treatment apparatus further includes: a correcting member including, in an outer surface, a contact portion which faces and is allowed to come into contact with an outer surface of the design body of the design brush; a relatively-positioning mechanism configured to place the correcting member in a target position determined relatively to the design brush by moving the correcting member relatively to the design brush; and a relatively-rotating mechanism configured to rotate the cleaning brush about a center axis of the shaft relatively to the correcting member, wherein a portion which is a combination of the design contact portion in an outer surface of a design pillar-shaped portion of the design body, which corresponds to the pillar-shaped portion, and a belt-shaped annular portion extending from an outer edge of the design contract portion in a direction in which the shaft extends, in the outer surface, is a body of revolution about the center axis, when the correcting member is placed in the target position, the contact portion overlaps an object portion which is a combination of at least a part in a circumferential direction in a portion corresponding to the belt-shaped annular portion in a rotation path of the body of revolution which is rotated relatively to the correcting member by the relatively-rotating mechanism, and a portion of the rotation path, which corresponds to the design contact portion, and the contact portion is formed to have an inverted shape of the object portion of the design brush, and a portion of the contact portion, which corresponds to the belt-shaped annular portion, is a center-axis facing surface which faces the center axis of the shaft.

In this apparatus, the brush body of the cleaning brush includes the substrate contact portion which forms an end surface of the pillar-shaped portion extending in a direction in which the shaft extends. The design brush has a design shape of the cleaning brush. The cleaning brush is rotated about the center axis of the shaft relatively to the correcting member. A portion which is a combination of the design contact portion of the design brush and the belt-shaped annular portion extending from an outer edge of the design contact portion is the body of revolution about the center axis of the shaft. The object portion is a portion which is a combination of at least a part in a circumferential direction in a portion corresponding to the belt-shaped annular portion in the rotation path of the body of revolution, and a portion of the rotation path, which corresponds to the design contact portion. Then, when the correcting member is placed in a target position, the contact portion of the correcting member overlaps the object portion. The contact portion is formed to have an inverted shape of the object portion, and a portion of the contact portion, which corresponds to the belt-shaped annular portion, is the center-axis facing surface which faces the center axis of the shaft. Accordingly, when the correcting member is placed in a target position, the substrate contact portion of the cleaning brush is restrained from expanding by the center-axis facing surface of the correcting member. As a result of this, variation in size of the substrate contact portion can be reduced. Further, in this apparatus, the cleaning brush is rotated about the center axis of the shaft relatively to the correcting member, so that the substrate contact portion of the cleaning brush is more forcibly restrained from expanding by the center-axis facing surface of the correcting member.

A substrate treatment apparatus in another different aspect of the present invention includes: a rotary holding mechanism configured to hold a substrate and rotate the substrate about a predetermined rotation axis; a cleaning brush including a brush body which is elastically deformable; and a brush moving mechanism including a shaft to which the cleaning brush is attached, the shaft extending in a direction transverse to a main surface of the substrate, and the brush moving mechanism being configured to move the cleaning brush by moving the shaft, wherein the brush body includes a pillar-shaped portion extending in a direction in which the shaft extends, and includes a substrate contact portion which is configured to come into the substrate, in a side surface of the pillar-shaped portion; the brush moving mechanism is capable of bringing the substrate contact portion of the brush body into contact with an outer edge portion of the substrate, a design brush is defined by a virtual cleaning brush which has a design shape of the cleaning brush and is attached to the shaft in a predetermined manner, a design body is defined by a portion of the design brush, which corresponds to the brush body, and a design contact portion is defined by a portion of the design body, which corresponds to the substrate contact portion. The substrate treatment apparatus further includes: a correcting member including, in an outer surface, a contact portion which faces and is allowed to come into contact with an outer surface of the design body of the design brush; and a relatively-positioning mechanism configured to place the correcting member in a target position determined relatively to the design brush by moving the correcting member relatively to the design brush, wherein when the correcting member is placed in the target position, the contact portion overlaps an object portion which includes the design contact portion in a side surface of a design pillar-shaped portion of the design body, which corresponds to the pillar-shaped portion, and the contact portion is formed to have an inverted shape of the object portion of the design brush, and is a center-axis facing surface which faces a center axis of the shaft.

In this apparatus, the brush body of the cleaning brush includes the substrate contact portion in a side surface of the pillar-shaped portion extending in a direction in which the shaft extends. The design brush has a design shape of the cleaning brush. The object portion is a portion including the design contact portion corresponding to the substrate contact portion, in a side surface of the design pillar-shaped portion of the design brush, which corresponds to the pillar-shaped portion. Then, when the correcting member is placed in a target position, the contact portion of the correcting member overlaps the object portion. The contact portion is formed to have an inverted shape of the object portion of the design brush, and is the center-axis facing surface which faces the center axis of the shaft. Accordingly, when the correcting member is placed in a target position, the substrate contact portion of the cleaning brush is restrained from expanding by the center-axis facing surface of the correcting member. As a result of this, variation in size of the substrate contact portion can be reduced.

A substrate treatment apparatus in another different aspect of the present invention includes: a rotary holding mechanism configured to hold a substrate and rotate the substrate about a predetermined rotation axis; a cleaning brush including a brush body which is elastically deformable; and a brush moving mechanism including a shaft to which the cleaning brush is attached, the shaft extending in a direction transverse to a main surface of the substrate, and the brush moving mechanism being configured to move the cleaning brush by moving the shaft, wherein the brush body includes a pillar-shaped portion extending in a direction in which the shaft extends, and includes a substrate contact portion which is configured to come into the substrate, in a side surface of the pillar-shaped portion; the brush moving mechanism is capable of bringing the substrate contact portion of the brush body into contact with an outer edge portion of the substrate, a design brush is defined by a virtual cleaning brush which has a design shape of the cleaning brush and is attached to the shaft in a predetermined manner, a design body is defined by a portion of the design brush, which corresponds to the brush body, and a design contact portion is defined by a portion of the design body, which corresponds to the substrate contact portion. The substrate treatment apparatus further includes: a correcting member including, in an outer surface, a contact portion which faces and is allowed to come into contact with an outer surface of the design body of the design brush; a relatively-positioning mechanism configured to place the correcting member in a target position determined relatively to the design brush by moving the correcting member relatively to the design brush; and a relatively-rotating mechanism configured to rotate the cleaning brush about a center axis of the shaft relatively to the correcting member, wherein an annular portion including the design contact portion in a side surface of a design pillar-shaped portion of the design body, which corresponds to the pillar-shaped portion, is a body of revolution about the center axis, when the correcting member is placed in the target position, the contact portion overlaps an object portion which is at least a part in a circumferential direction in a rotation path of the body of revolution which is rotated relatively to the correcting member by the relatively-rotating mechanism, and the contact portion is formed to have an inverted shape of the object portion of the design brush, and is a center-axis facing surface which faces the center axis of the shaft.

In this apparatus, the brush body of the cleaning brush includes the substrate contact portion in a side surface of the pillar-shaped portion extending in a direction in which the shaft extends. The design brush has a design shape of the cleaning brush. The cleaning brush is rotated about the center axis of the shaft relatively to the correcting member. The annular portion including the design contact portion in a side surface of the design pillar-shaped portion of the design brush is the body of revolution about the center axis of the shaft. The object portion in the design brush is at least a part in a circumferential direction in the rotation path of the body of revolution. When the correcting member is placed in a target position, the contact portion of the correcting member overlaps the object portion. The contact portion is formed to have an inverted shape of the object portion of the design brush, and is the center-axis facing surface which faces the center axis of the shaft. Accordingly, when the correcting member is placed in a target position, the substrate contact portion of the cleaning brush is restrained from expanding by the center-axis facing surface of the correcting member. As a result of this, variation in size of the substrate contact portion can be reduced. Further, in this apparatus, the cleaning brush is rotated about the center axis of the shaft relatively to the correcting member, so that the substrate contact portion of the cleaning brush is more forcibly restrained from expanding by the center-axis facing surface of the correcting member.

Therefore, an object of the present invention is to provide techniques which allow reduction of variation in size of a substrate contact portion which comes into contact with a substrate, in a brush body of a cleaning brush.

These and other objects, features, aspects and advantages of the present invention will become more apparent from the following detailed description of the present invention when taken in conjunction with the accompanying drawings.

BRIEF DESCRIPTION OF THE DRAWINGS

FIG. 10 is a schematic cross-sectional view for explaining an example of a procedure for cleaning a brush body and a correcting member;

FIG. 11 is a schematic view for explaining an example of timing of cleaning of a substrate with the cleaning brush and timing of cleaning of a correcting member;

FIG. 22 is a top view schematically showing an example of arrangement of nozzles which feed a cleaning liquid to a cleaning brush being corrected;

DESCRIPTION OF THE PREFERRED EMBODIMENTS

Figure 1:
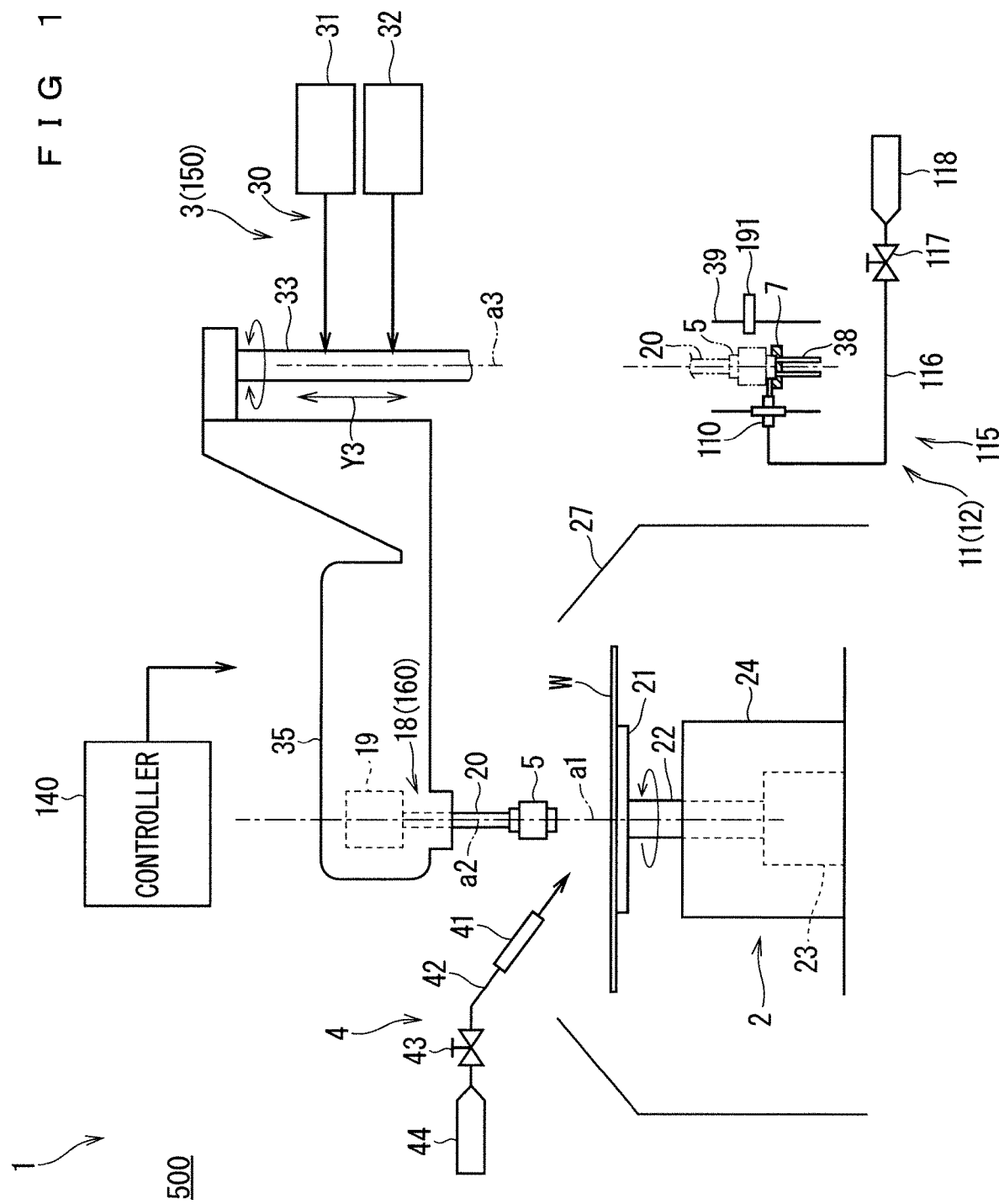
FIG. 1 is a side view schematically showing an overall configuration of a substrate treatment apparatus according to a first preferred embodiment of the present invention.

Hereinafter, preferred embodiments will be described with reference to the drawings. The following preferred embodiments are examples resulted from embodying of the present invention, and are not instances which limit a technical scope of the present invention. Also, in the drawings which will be later referred to, dimensions and the number of elements are sometimes exaggerated or simplified in showing, for easier understanding. Also, in the drawings, parts which have the same configuration and the same function are denoted by the same reference symbols, and duplicated description will be omitted in the following description. An upward/downward direction is a vertical direction, and a side on which a substrate is provided will be regarded as an upper portion with respect to a spin chuck.

First Preferred Embodiment

<Configuration of Substrate Treatment Apparatus 1>

Figure 2:
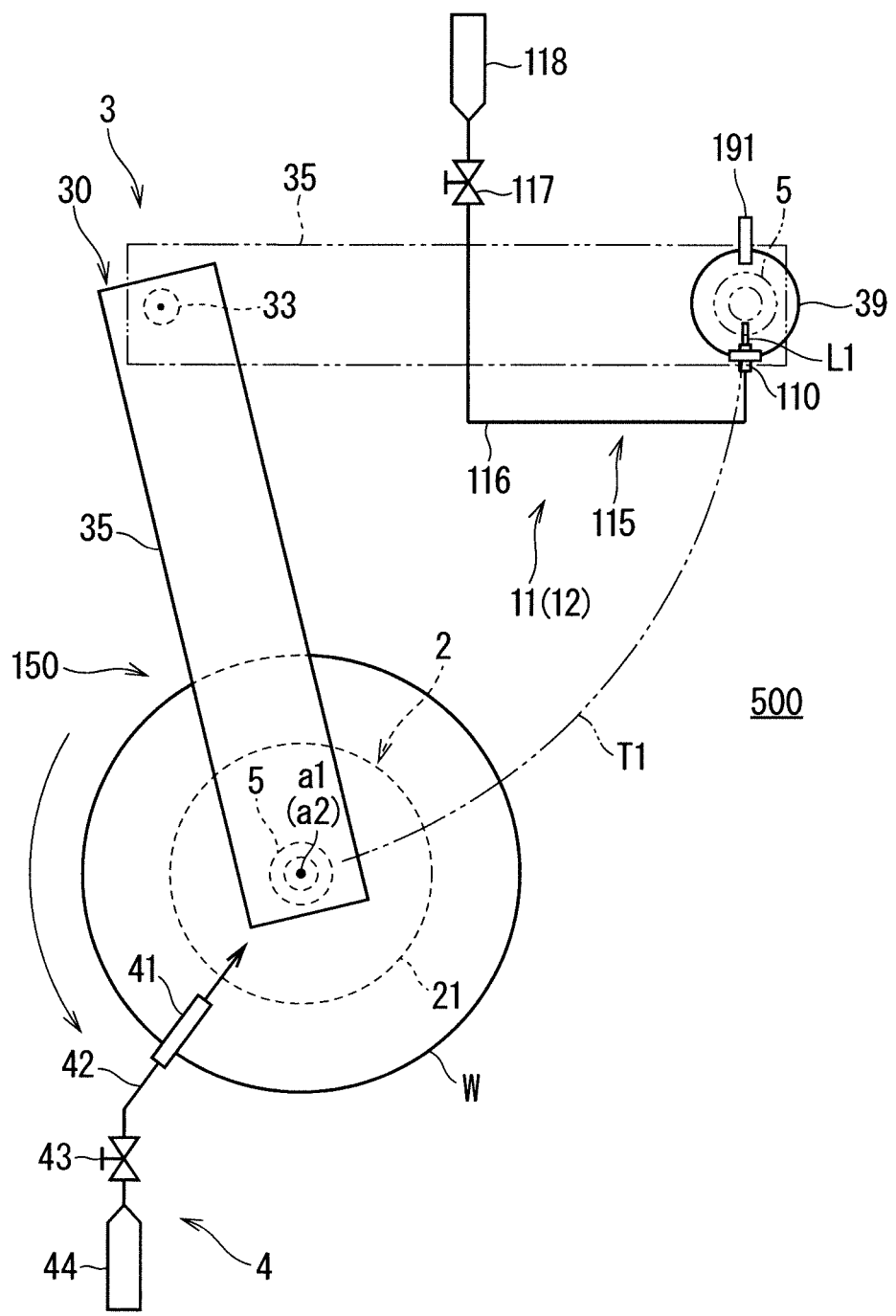
FIG. 2 is a plan view schematically showing an overall configuration of the substrate treatment apparatus in FIG. 1.
Figure 3:
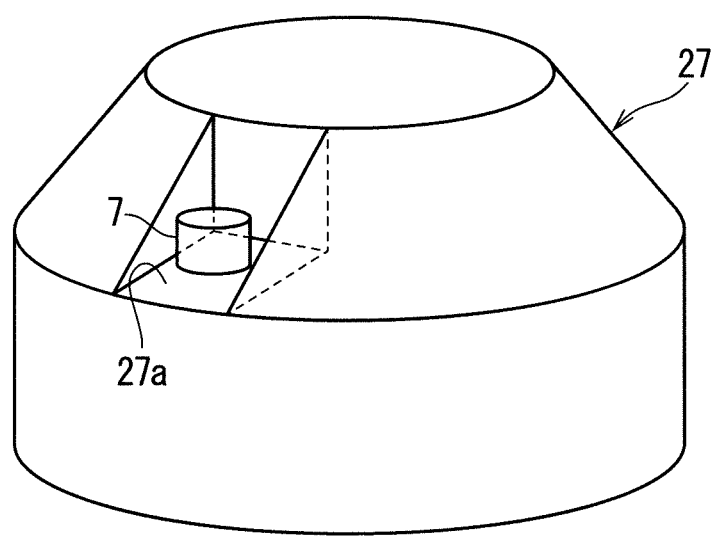
FIG. 3 is a perspective view schematically showing another example of placement of a correcting member in FIG. 1.

FIG. 1 is a side view schematically showing an overall configuration of a substrate treatment apparatus 1 according to a first preferred embodiment. FIG. 2 is a plan view schematically showing an overall configuration of the substrate treatment apparatus 1. FIG. 3 is a perspective view schematically showing another example of placement of a correcting member.

The substrate treatment apparatus 1 is a single-wafer processing apparatus which cleans a substrate W while pressing a cleaning brush 5 against the substrate W. The substrate treatment apparatus 1 includes: a rotary holding mechanism 2 which rotates the substrate W while holding the substrate W in a horizontal posture within a treatment space surrounded by a chamber ("housing") not shown; a treatment-liquid feeding mechanism 4 which feeds a treatment liquid to the substrate W; the cleaning brush 5 which cleans the substrate W; a standby pod 39 in a tubular shape provided in a retraction position of the cleaning brush 5, into which the cleaning brush 5 is housed; a correcting member (which is also referred to as a "mold") 7 provided in the standby pod 39; a brush moving mechanism 3 which moves the cleaning brush 5; a brush rotating mechanism 18 which rotates a shaft 20 connected with the cleaning brush 5 and thus rotates the cleaning brush 5 attached to the shaft 20; a brush cleaning mechanism 11 which cleans the cleaning brush 5 in the standby pod 39; a splash guard 27 which prevents a treatment liquid fed to the substrate W from splashing; and a measurement instrument 191 which measures an amount of deformation of a brush body 51 of the cleaning brush 5.

<Rotary Holding Mechanism 2>

The rotary holding mechanism 2, which is a rotatable substrate holder, holds the substrate W in a horizontal posture, and rotates the substrate W being held in a horizontal posture, about a rotation axis a1 which extends in a vertical direction. The rotary holding mechanism 2 is a chuck mechanism of a vacuum-suction type. The rotary holding mechanism 2 includes a spin chuck ("substrate holding mechanism") 21 which holds the substrate W in a horizontal posture, a rotation shaft 22 which has a tubular shape and extends downward from the spin chuck 21, and a rotation driving mechanism 23 which rotates the spin chuck 21 and the rotation shaft 22. A lower portion of the rotation shaft 22 and the rotation driving mechanism 23 are housed in a casing 24 in a tubular shape.

The rotation shaft 22 is provided to extend upward from the rotation driving mechanism 23 in a vertical direction, and is connected to the rotation driving mechanism 23. The spin chuck 21 which holds the substrate W by sucking a lower surface of the substrate W is attached to an upper end of the rotation shaft 22. The substrate W is held in a substantially horizontal posture by the spin chuck 21 so that an upper surface thereof faces upward.

The rotation driving mechanism 23 includes a servo motor and a gear mechanism which transfers rotation of the servo motor to the rotation shaft 22, for example. The rotation shaft 22 transfers a driving force of the rotation driving mechanism 23 to the spin chuck 21. As a result of this, the substrate W, integrally with the spin chuck 21, is rotated about the rotation axis a1 which vertically passes through a center of the substrate W. It is noted that though the first preferred embodiment describes the rotary holding mechanism 2 of suction type as an example, the rotary holding mechanism 2 may alternatively be a chuck mechanism of pinching type which holds the substrate W with the use of a plurality of substrate pinching members.

<Brush Rotating Mechanism 18>

The brush rotating mechanism 18 includes a rotation driving mechanism 19 placed in an arm 35, and the shaft 20 connected to the rotation driving mechanism 19. The shaft 20 is stainless steel or the like which has a shape of a four-sided pillar, for example. A nut (not shown) used for detachably fixing the cleaning brush 5 is provided at a lower end of the shaft 20. The nut fixes the cleaning brush 5 to a lower end of the shaft 20 via a screw provided around an attachment part (not shown) which is provided at an upper end of the cleaning brush 5 so as to protrude, for example.

The rotation driving mechanism 19 includes a servo motor and a gear mechanism which transfers rotation of the serve motor to the shaft 20, for example. The shaft 20 extends in a vertical direction, that is, in a direction transverse to an upper surface ("main surface") of the substrate W. An upper end of the shaft 20 is connected to the rotation driving mechanism 19. Also, a lower end of the shaft 20 protrudes downward from the arm 35. The shaft 20 is driven and rotated about a center axis a2 of the shaft 20 by the rotation driving mechanism 19. As a result of this, the cleaning brush 5 attached to the shaft 20 is driven and rotated about the center axis a2, integrally with the shaft 20.

The brush rotating mechanism 18 operates also as a relatively-rotating mechanism 160 which rotates the cleaning brush 5 about the center axis a2 of the shaft 20 relatively to a correcting member 7 which will be later described. That is, the brush rotating mechanism 18 is configured to be operable also as the relatively-rotating mechanism 160. The relatively-rotating mechanism 160 may be provided as a mechanism distinct from the brush rotating mechanism 18. In other words, the relatively-rotating mechanism is a brush rotator.

<Brush Moving Mechanism 3>

The brush moving mechanism 3, in other words, a brush mover, includes the arm 35 which extends substantially horizontally above a position where the substrate W is held by the rotary holding mechanism 2, and an arm moving mechanism 30 which moves the arm 35.

The arm moving mechanism 30 moves the cleaning brush 5 integrally with the arm 35 by moving the arm 35. The arm moving mechanism 30 includes an arm supporting shaft 33 which supports the arm 35 and extends in a vertical direction, an elevation driving mechanism 31, and a rotation driving mechanism 32 which are connected to the arm supporting shaft 33.

The elevation driving mechanism 31 is configured to be capable of raising and lowering the arm 35. When a driving force of the elevation driving mechanism 31 is transferred to the arm supporting shaft 33, the arm supporting shaft 33 is raised or lowered, so that the arm 35 and the cleaning brush 5 are raised or lowered integrally with each other. The elevation driving mechanism 31 includes a servo motor, a ball screw which converts rotation of the servo motor into linear motion and transfers linear motion to the arm supporting shaft 33, and the like, for example.

The rotation driving mechanism 32 transfers a driving force thereof to the arm supporting shaft 33, and rotates the arm supporting shaft 33 about a rotation axis a3. The rotation axis a3 extends vertically along the arm supporting shaft 33. The arm 35 is configured to be rotatable about the rotation axis a3 along a horizontal plane. As a result of rotation of the arm 35, the cleaning brush 5 rotates about the rotation axis a3 integrally with the arm 35. FIG. 2 shows an example in which the cleaning brush 5 is moved along a substantially arc-shaped path T1 which starts from a position above a standby position of the cleaning brush 5 (a position indicated by a circular chain double-dashed line) which is set outside a rotation range of the substrate W, and runs above a central portion of an upper surface of the substrate W. The standby pod 39 is provided outside a rotation range of the substrate W. The rotation driving mechanism 32 includes a serve motor and a gear mechanism which transfers rotation of the servo motor to the arm supporting shaft 33, and the like, for example.

The brush moving mechanism 3 can move the cleaning brush 5 in a horizontal plane with a substrate contact portion 53 which forms a lower end surface of the brush body 51 of the cleaning brush 5 being kept in contact with an upper surface of the substrate W. As a result of this, an upper surface of the substrate W is cleaned by the brush body 51.

As described above, the brush moving mechanism 3 can raise and lower the cleaning brush 5, and also can move the cleaning brush 5 along the path T1 in a horizontal plane.

The brush moving mechanism 3 of the substrate treatment apparatus 1 moves the correcting member 7 later described, relatively to a design brush 6 later described, to thereby operate also as a relatively-positioning mechanism 150 which places the correcting member 7 in a target position which is determined relatively to the design brush 6. In other words, the brush moving mechanism 3 is configured to be operable also as the relatively-positioning mechanism 150. The relatively-positioning mechanism 150 may be provided as a mechanism distinct from the brush moving mechanism 3.

<Cleaning Brush 5>

Figure 4:
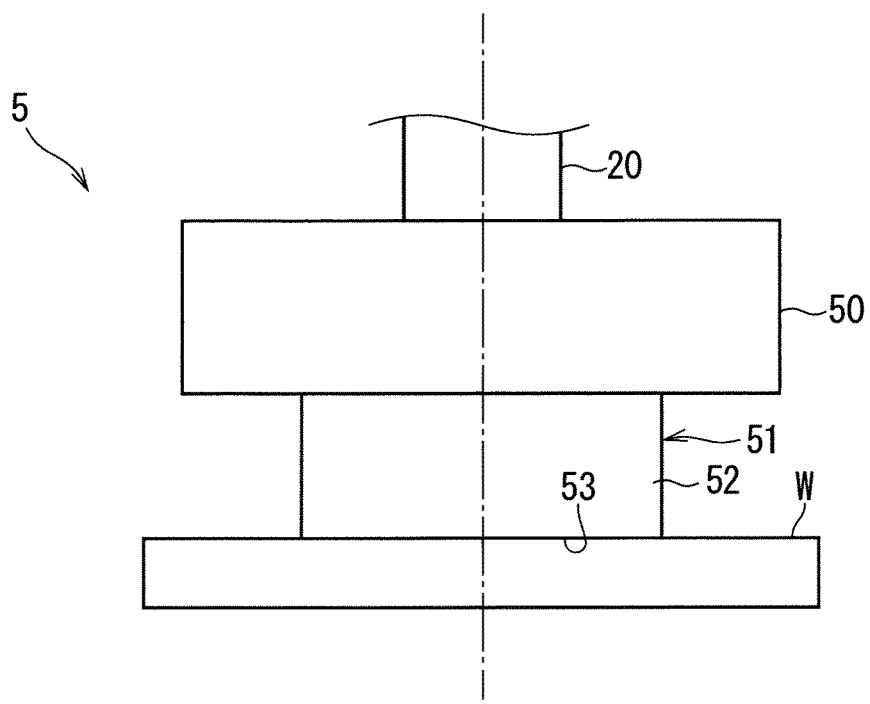
FIG. 4 is a side view schematically showing a cleaning brush in FIG. 1 in a case where a substrate contact portion thereof is not inclined.

FIG. 4 is a side view schematically showing the cleaning brush 5. The cleaning brush 5 in FIG. 4 has the substrate contact portion 53 which is parallel to an upper surface of the substrate W. In other words, the cleaning brush 5 is in contact with an upper surface of the substrate W with the substrate contact portion 53 being not inclined with respect to an upper surface of the substrate W.

The cleaning brush 5 includes the brush body 51 and the brush holder 50 which holds the brush body 51. The brush holder 50 is removably attached to an end (lower end) of the shaft 20 via a nut or the like not shown in the drawings. As a result, the cleaning brush 5 is removably connected to a lower end of the shaft 20. In this state, when an upper portion of the brush body 51 is housed into and held by the brush holder 50, a pillar-shaped portion 52 which is a portion of the brush body 51 protrudes downward from a lower surface of the brush holder 50. The substrate treatment apparatus 1 moves the cleaning brush 5 integrally with the arm 35 with the use of the brush moving mechanism 3, to bring the brush body 51 into contact with a surface of the substrate W. The brush holder 50 is integrally formed of a plastic material such as polypropylene, for example. The brush body 51 is formed of an olefin-based rein, a fluororesin, polyvinyl alcohol (PVA), polyethylene, a urethane resin, or the like, for example, and is elastically deformable.

In the present specification, a statement that a brush body is elastically deformable means that a geometrical shape of a brush body is changed under the influence of a force acting the brush body, and the brush body can return to a shape close to the original geometrical shape immediately after the force acting the brush body is cancelled.

The brush body 51 of the cleaning brush 5 is scanned while being pressed against a surface of the substrate W being rotating, by the brush moving mechanism 3. The brush body 51 deforms for the reasons that the substrate W is harder than the brush body 51 and the substrate W rotates about the rotation axis a1, and for other like reasons.

Figure 5:
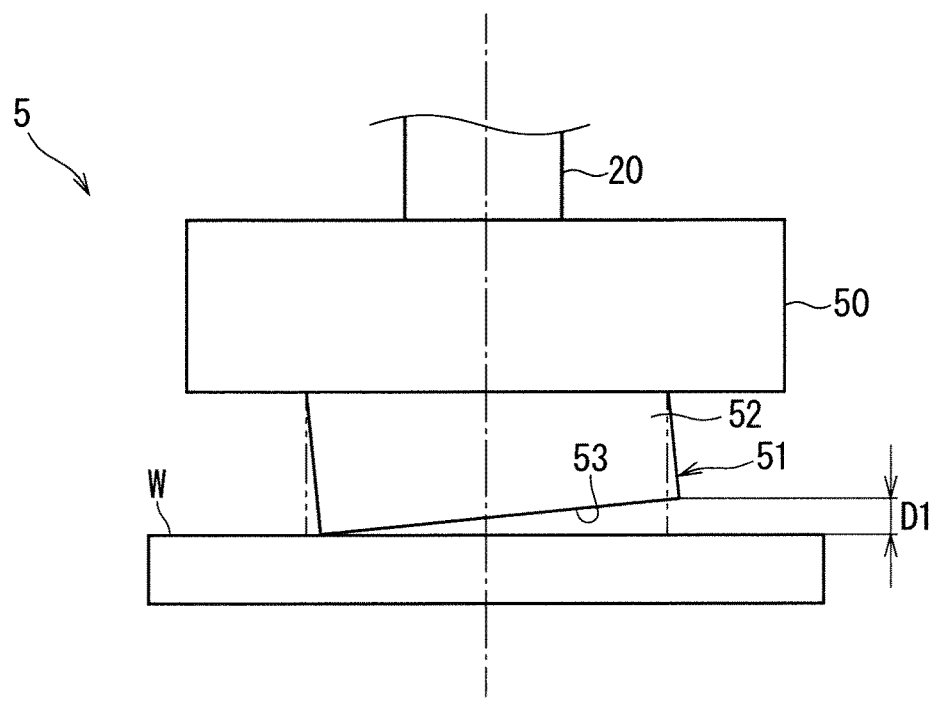
FIG. 5 is a side view schematically showing the cleaning brush in FIG. 1 in a case where the substrate contact portion thereof is inclined.

FIG. 5 is a side view schematically showing the cleaning brush 5 in a case where the brush body 51 deforms and the substrate contact portion 53 is inclined. When one end of a diameter of the substrate contact portion 53 is in contact with an upper surface of the substrate W and the other end of a diameter of the substrate contact portion 53 is separated from an upper surface of the substrate W, for example, an inclination of the substrate contact portion 53 is shown as a distance D1 between an upper surface of the substrate W and the other end (the distance is also referred to as "flatness of a brush").

Figure 6:
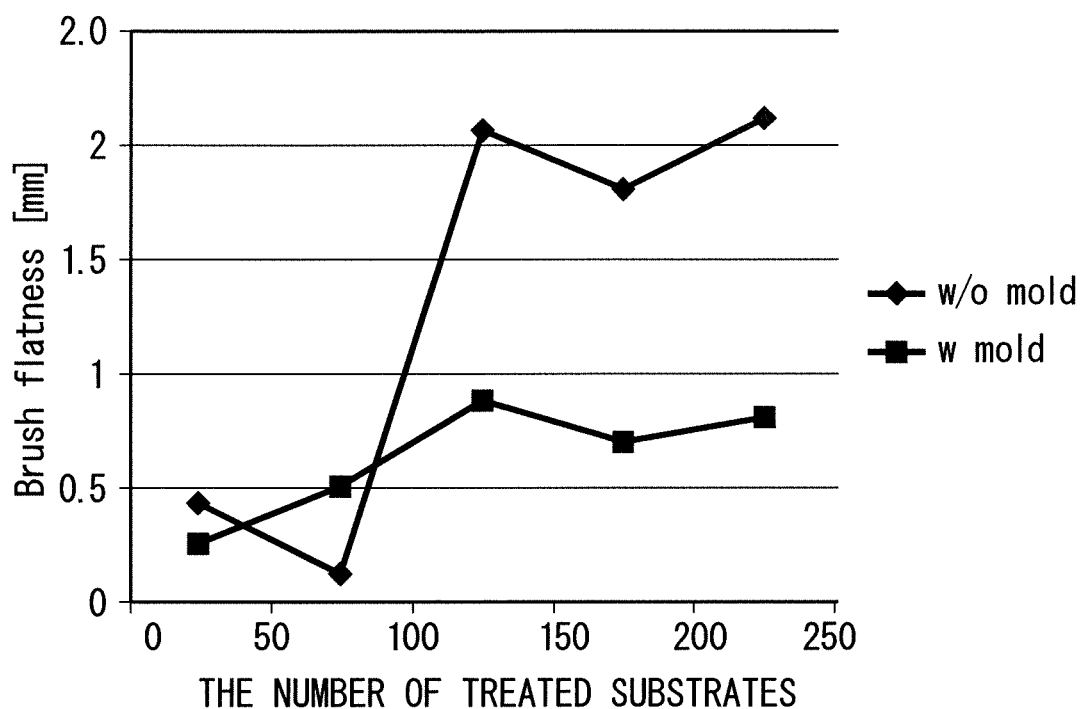
FIG. 6 is a view showing an example of a relationship between an inclination of the substrate contact portion and the number of treated substrates, in a graph form.
Figure 7:
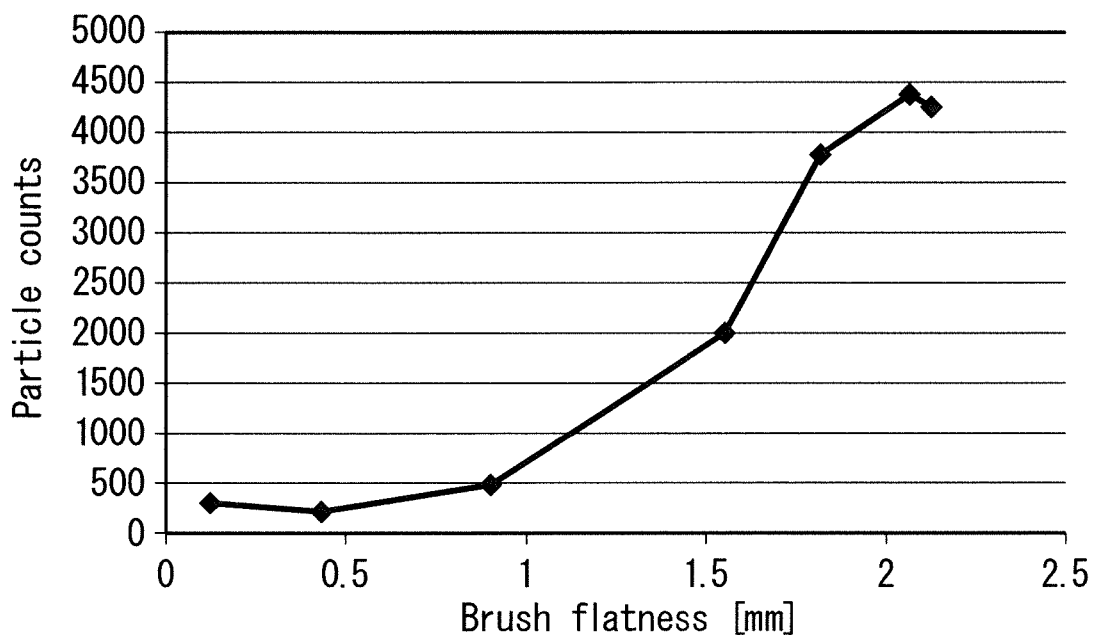
FIG. 7 is a view showing an example of a relationship between an inclination of the substrate contact portion and the number of particles, in a graph form.

FIG. 6 is a view showing one example of a relationship between an inclination (distance D1) of the substrate contact portion 53 and the number of treated substrates W, in a graph form. FIG. 7 is a view showing one example of a relationship between an inclination (distance D1) of the substrate contact portion 53 and the number of particles, in a graph form.

An inclination of the substrate contact portion 53 is corrected with the use of the correcting member 7 later described. FIG. 6 shows relationships between the number of treated substrates and the distance D1 in respective cases where the correcting member 7 is used (a line on which square marks are put, in the graph), and where the correcting member 7 is not used (a line on which rhombus-shaped marks are put, in the graph). As shown in FIG. 6, a rate of increase of the distance D1 to the number of treated substrates in the case where the correcting member 7 is not used is significantly higher than that in the case where the correcting member 7 is used. Also, in the example shown in FIG. 7, after the distance D1 exceeds 1.5 mm, the number of residual particles in the substrate W is significantly increased.

<Design Brush 6 and Correcting Member 7>

Figure 8:
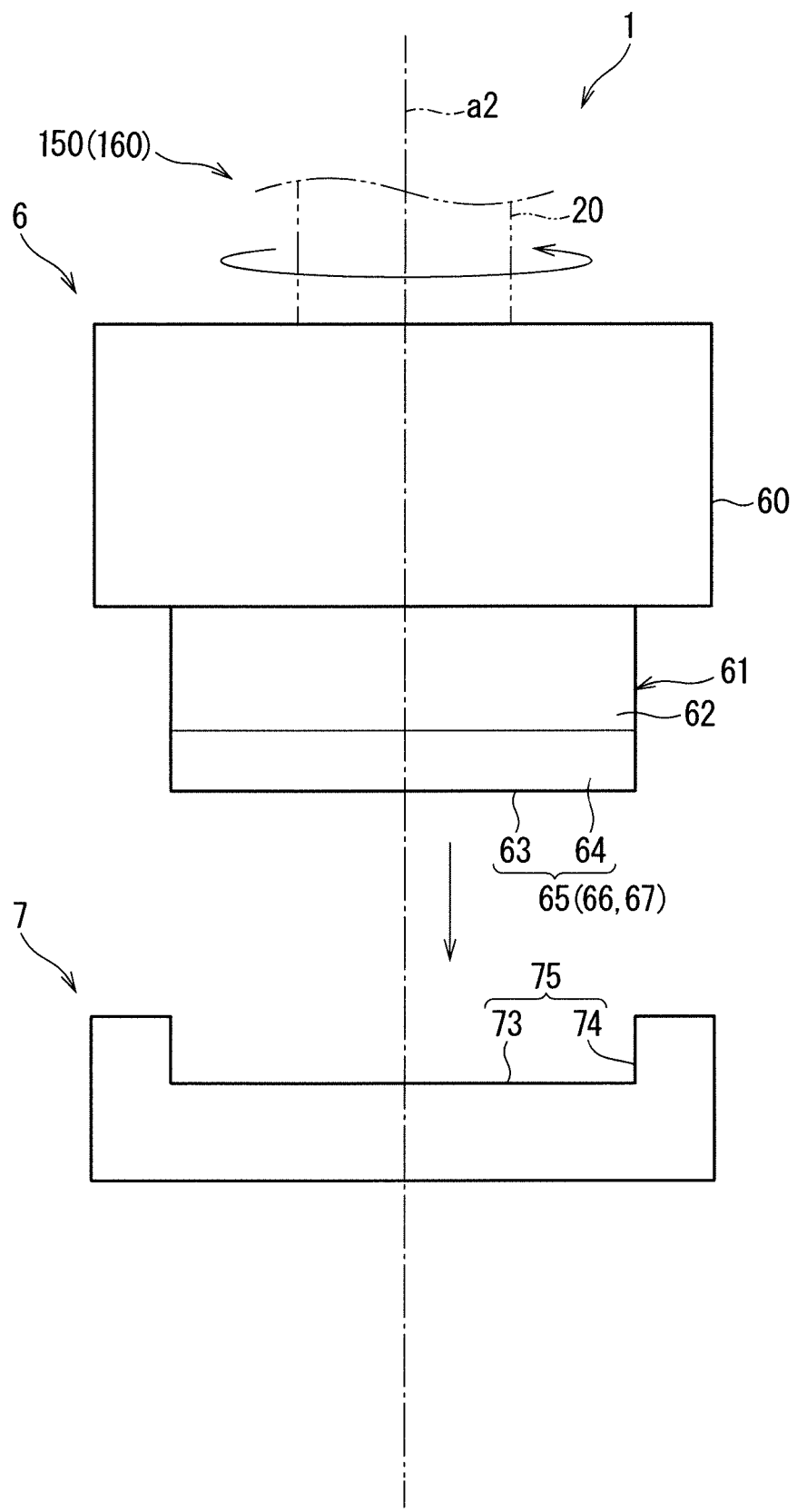
FIG. 8 is a schematic cross-sectional view for explaining an example of a configuration of a design brush and a correcting member.

FIG. 8 is a schematic cross-sectional view for explaining an example of a configuration of a design brush 6 and the correcting member 7. The design brush 6 is a virtual cleaning brush which is attached to the shaft 20 in a predetermined manner, having a design shape which is a shape designed for the cleaning brush 5. A design brush holder 60 is a portion of the design brush 6, which corresponds to the brush holder 50 of the cleaning brush 5. A design body 61 is a portion of the design brush 6, which corresponds to the brush body 51 of the cleaning brush 5. A design contact portion 63 is a portion of the design body 61, which corresponds to the substrate contact portion 53 of the brush body 51. A design pillar-shaped portion 62 is a portion of the design brush 6, which corresponds to the pillar-shaped portion 52 of the cleaning brush 5.

The correcting member 7 is a member which includes a contact portion 75 in an outer surface thereof. When the correcting member 7 is placed in a target position which is determined relatively to the design brush 6, the contact portion 75 comes into contact with an outer surface of the design body 61 of the design brush 6. In the substrate treatment apparatus 1, a shape of the cleaning brush 5 is corrected with the correcting member 7 being placed in a target position. In other words, the correcting member 7 shapes the brush and is therefore a brush shaper.

The design brush 6 and the correcting member 7 according to the first preferred embodiment will be described about each of a first case where the cleaning brush 5 is corrected while being rotated about the center axis a2 of the shaft 20 relatively to the correcting member 7, and a second case where the cleaning brush 5 is corrected without being rotated relatively to the correcting member 7. It is noted that the correcting member 7 is formed of a resin or a glass-based material such as quartz, PTFE, PVC, PFA, PP, or PS, for example. A material of the correcting member 7 is harder than that of the brush body 51. The correcting member 7 is formed of a substantially non-abrasive material. Preferably, the correcting member 7 is formed of a material not including an abrasive.

<Design Brush 6 and Correcting Member 7 in the First Case>

In the first case, a portion which is a combination of the design contact portion 63 and a belt-shaped annular portion 64 in the design body 61 of the design brush 6 is a body of revolution 66 which rotates about the center axis a2. The belt-shaped annular portion 64 is a portion which has a substantially constant width and extends from an outer edge of the design contact portion 63 in a direction in which the shaft 20 extends, in an outer surface of the design pillar-shaped portion 62.

When the correcting member 7 is placed in a target position, the contact portion 75 of the correcting member 7 overlaps an object portion 65 which is a combination of: at least a part in a circumferential direction in a portion corresponding to the belt-shaped annular portion 64 in a rotation path 67 of the body of revolution 66 rotating relatively to the correcting member 7, and a portion of the rotation path 67, which corresponds to the design contact portion 63.

The contact portion 75 is formed to have an inverted shape of the object portion 65 of the design brush 6, and a portion of the contact portion 75, which corresponds to the belt-shaped annular portion 64, is a center-axis facing surface 74 which faces the center axis a2 of the shaft 20.

FIG. 8 shows an example of a configuration of the design brush 6 and the correcting member 7 for the first case. In FIG. 8, the design contact portion 63 of the design brush 6 is a circle which is orthogonal to the center axis a2 and has a center through which the center axis a2 passes. The belt-shaped annular portion 64 is erected vertically from an outer edge of the design contact portion 63. The correcting member 7 includes a circular plate portion having a horizontal upper surface and a wall portion which is erected upward from the outer edge portion of the circular plate portion and extends along an outer edge portion of the circular plate portion. When the correcting member 7 is placed in a target position, a portion of an upper surface of the circular plate portion, which is surrounded by the wall portion (a bottom surface 73), overlaps the design contact portion 63 of the design brush 6, and an inner surface of the wall portion (the center-axis facing surface 74) overlaps the belt-shaped annular portion 64 of the design brush 6.

<Design Brush 6 and Correcting Member 7 in the Second Case>

In the second case, a portion which is a combination of the design contact portion 63 and the belt-shaped annular portion 64 in the design body 61 of the design brush 6 is not necessarily required to form a body of revolution about the center axis a2.

When the correcting member 7 is placed in a target position, the contact portion 75 of the correcting member 7 overlaps the object portion 65 which is a combination of the design contact portion 63 and the belt-shaped annular portion 64 of the design brush 6.

The contact portion 75 is formed to have an inverted shape of the object portion 65 of the design brush 6, and a portion of the contact portion 75, which corresponds to the belt-shaped annular portion 64, is the center-axis facing surface 74 which faces the center axis a2 of the shaft 20.

Figure 28:
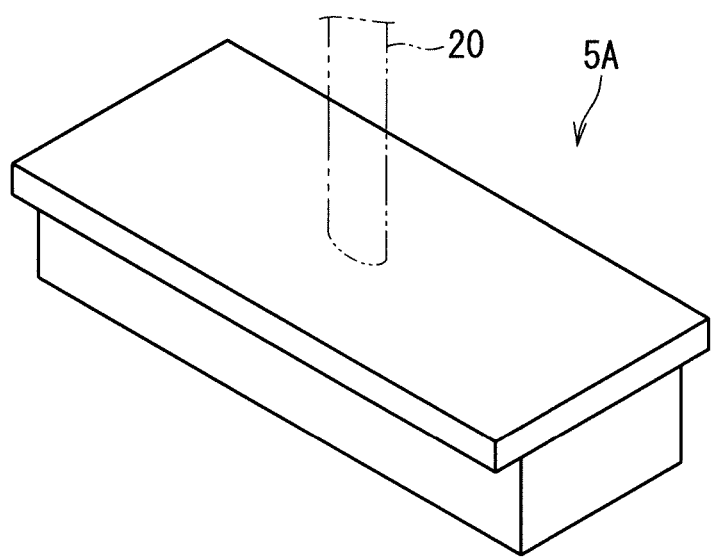
FIG. 28 is a perspective view showing an example of a cleaning brush.

FIG. 28 is a perspective view showing a cleaning brush 5A which is an example of a cleaning brush used for cleaning a main surface of the substrate W. In the cleaning brush 5A, a brush body is housed in a brush holder having a shape of a rectangular parallelepiped. Also a portion of the brush body, which protrudes downward from the brush holder, is formed to have a shape of a rectangular parallelepiped. A lower end surface of the brush body is a substrate contact portion. For example, a shape of the cleaning brush 5 can be corrected by the correcting member 7 in both of the above-described first and second cases. However, the cleaning brush 5A is corrected without being rotated relatively to the correcting member 7. A correcting member used for correction of the cleaning brush 5A includes a flat-plate portion which has a shape of a rectangular parallelepiped corresponding to a shape of the brush body, and a frame portion (wall portion) which extends along an outer edge of the flat-plate portion and protrudes upward from the outer edge, for example.

<Treatment-Liquid Feeding Mechanism 4>

The treatment-liquid feeding mechanism 4 includes a nozzle 41 which discharges a treatment liquid (for example, pure water (deionized water), carbonated water, hydrogen water, ammonia water, SC1, NH4OH, an aqueous solution of citrate, FOM, FPM, HF, SC2, HCl, IPA, TMAH, an aqueous solution of trimethyl-2-hydroxyethyl ammonium hydroxide (CHOLINE), or the like), toward an upper surface of the substrate W. A treatment liquid provided from a treatment-liquid source 44 is fed to the nozzle 41 through a pipe 42. An on/off valve 43 is interposed at some midpoint in the pipe 42. To open or close the on/off valve 43 could switch a state of a treatment liquid provided from the nozzle 41 between discharge and stop. The nozzle 41 discharges a treatment liquid fed through the pipe 42, toward an upper surface of the substrate W which is being rotated by the spin chuck 21. A treatment liquid discharged from the nozzle 41 is fed over a range including a center of rotation in an upper surface of the substrate W.

<Splash Guard 27>

The substrate treatment apparatus 1 includes the splash guard ("cup") 27 which prevents a treatment liquid fed to the substrate W from splashing. The splash guard 27 is a tubular member having an upper portion, a diameter of which decreases toward an upper end. A diameter of an upper end of the splash guard 27 is slightly larger than a diameter of each of the substrate W and the casing 24. The splash guard 27 is raised to an upper position where an upper end of the splash guard 27 is positioned above the substrate W, and is lowered to a retraction position where an upper end of the splash guard 27 is positioned below the substrate W, by an elevation mechanism not shown. While the treatment-liquid feeding mechanism 4 is discharging a treatment liquid toward an upper surface of the substrate W, the splash guard 27 is placed in an upper position and receives a treatment liquid discharged from an outer edge of the substrate W at an inner wall surface thereof. A treatment liquid, which is received by the splash guard 27, is then collected into a designated container or the like through a drain pipe not shown which is provided below the splash guard 27.

<Standby Pod 39>

The substrate treatment apparatus 1 includes the standby pod 39 which has a tubular shape and is placed in a standby position of the cleaning brush 5. The standby pod 39 has a shape of a tube which has opened upper and lower ends and extends in a vertical direction. The correcting member 7 having an upper surface in which a recessed portion is formed is provided in the standby pod 39. A surface of the recessed portion is the contact portion 75. A cleaning liquid is fed to the standby pod 39 from the brush cleaning mechanism 11. A cleaning liquid is hit against the recessed portion of the correcting member 7, and is then discharged by a drain pipe 38 which opens to the recessed portion of the correcting member 7 and extends downward. It is noted that a position where the cleaning brush 5 is housed in the correcting member 7 within the standby pod 39 is a standby position of the cleaning brush 5.

<Brush Cleaning Mechanism 11>

The brush cleaning mechanism 11 includes a nozzle 110 which feeds a cleaning liquid (for example, carbonated water, pure water, hydrogen water, ammonia water, SC1, NH4OH, an aqueous solution of citrate, FOM, FPM, HF, SC2, HCl, IPA, TMAH, an aqueous solution of trimethyl-2-hydroxyethyl ammonium hydroxide (CHOLINE), or the liked), toward a substrate contact portion 53 of the cleaning brush 5, and a cleaning-liquid feeding mechanism 115 which communicates with the nozzle 110 and feeds a cleaning liquid to the nozzle 110. The cleaning-liquid feeding mechanism 115 includes a cleaning-liquid source 118, and a pipe 116 which guides a cleaning liquid fed by the cleaning-liquid source 118 to the nozzle 110. An on/off valve 117 is provided at some midpoint in the pipe 116. To open or close the on/off valve 117 could switch a state of a cleaning liquid provided from the nozzle 110, between discharge and stop.

The brush cleaning mechanism 11 is configured to be operable also as a correcting-member cleaning mechanism 12 which feeds a cleaning liquid to the correcting member 7 and cleans the correcting member 7. It is noted that the brush cleaning mechanism 11 and the correcting-member cleaning mechanism 12 may be provided as mechanisms distinct from each other.

<Measurement Instrument 191>

The measurement instrument 191 is a detector which detects an amount of change in a size of the brush body 51. The measurement instrument 191 is formed of a laser displacement gage, for example. The measurement instrument 191 may be implemented by triangulation performed by radar, an image measurement instrument, or the like. In other words, the measurement instrument is a size measuring device. An output of the measurement instrument 191 is provided to a controller 140, and the controller 140 gives an alarm, stops a cleaning process, or performs other like operations when the controller 140 detects malfunction based on the provided output. In a case where the cleaning brush 5 is rotated, a change in size of an entire circumference of the brush body 51 can be measured by measurement of a single portion of a rotation path of the brush body 51.

<Controller 140>

The substrate treatment apparatus 1 includes the controller 140 used for control of respective parts. For a configuration of the controller 140 in terms of a hardware, the same configuration as that of a general computer can be used, for example. That is, the controller 140 includes a CPU which performs various kinds of arithmetic processing, a ROM, i.e., a read-only memory in which a basic program is stored, a RAM which is a writable and readable memory in which various kinds of information are stored, and a storage device in which programs or data for various kinds of processing are stored, which are connected to a bus line. In the storage device, details of treatment for the substrate W, a recipe which defines a procedure of treatment, and the like are also stored.

Respective parts of the substrate treatment apparatus 1, such as the rotary holding mechanism 2, the brush moving mechanism 3, the treatment-liquid feeding mechanism 4, the brush cleaning mechanism 11, the correcting-member cleaning mechanism 12, the relatively-positioning mechanism 150, the relatively-rotating mechanism 160, a fluid feeding mechanism 170, and the brush rotating mechanism 18, operate under the control of the controller 140.

<Operations of Substrate Treatment Apparatus 1>

Figure 9:
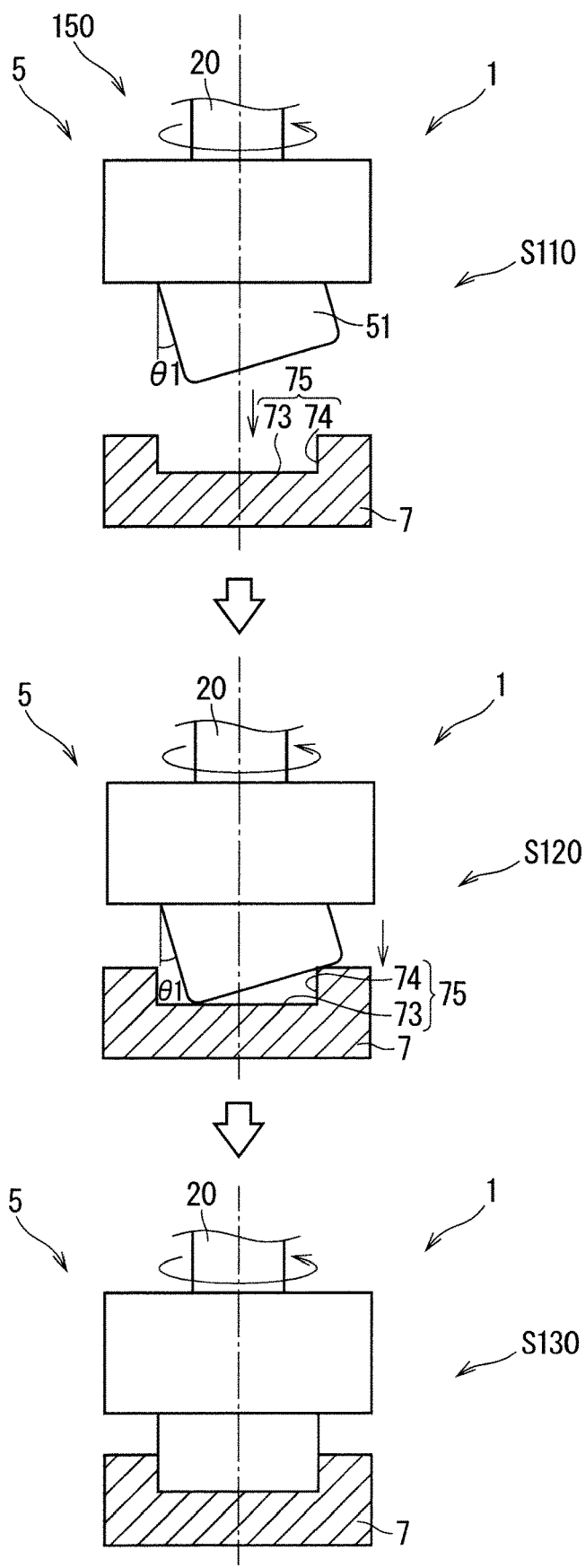
FIG. 9 is a view for explaining a manner in which a brush body of a cleaning brush is corrected.

FIG. 9 is a view for explaining a manner in which a brush body of a cleaning brush is corrected, in a time sequence. In a first step S110, a side surface of the brush body 51 of the cleaning brush 5 is inclined at an angle θ1 to a vertical direction. The angle θ1 is 0.1 degree to 0.3 degree, for example. When the relatively-positioning mechanism 150 lowers the cleaning brush 5 from above the correcting member 7 (step S110), a lower end of the brush body 51 comes into contact with a wall portion of the correcting member 7, which forms the center-axis facing surface 74 (step S120). Subsequently, the cleaning brush 5 is further inserted into the contact portion 75, so that the brush body 51 is pressed against the contact portion 75, to be corrected into a shape of the design brush 6 (step S130).

FIG. 10 is a schematic cross-sectional view for explaining an example of a procedure for cleaning the brush body 51 and the correcting member 7. The substrate treatment apparatus 1 includes the brush cleaning mechanism 11 which can feed a cleaning liquid to the brush body 51 of the cleaning brush 5 and clean the brush body 51 with the correcting member 7 being placed in a target position relative to the design brush 6. In other words, the brush cleaning mechanism is a brush cleaner. The cleaning brush 5, which finishes cleaning the substrate W, is placed in a retraction position by the brush moving mechanism 3, and the correcting member 7 is placed in a target position by the relatively-positioning mechanism 150 (brush moving mechanism 3). Then, when a correcting process of the brush body 51 is started, the brush cleaning mechanism 11 discharges a fluid flow L1 of a cleaning liquid toward the brush body 51 from the nozzle 110, to clean the brush body 51. As a result of this, prevention of drying of the brush body 51 can be also achieved.

After correction of the brush body 51 is finished and the cleaning brush 5 is carried out from the correcting member 7, the brush cleaning mechanism 11 can clean the contact portion 75 of the correcting member 7 by reducing a flow rate of a cleaning liquid, for example, or performing other like operations. It is noted that an opening of the on/off valve 117 is variable.

FIG. 11 is a schematic view for explaining an example of timing of cleaning of the substrate W with the cleaning brush 5 and timing of cleaning of the correcting member 7. In the example shown in FIG. 11, while the substrate treatment apparatus 1 is cleaning an upper surface of the substrate W by using the cleaning brush 5, a cleaning liquid is discharged to the correcting member 7 from the nozzle 110. As a result of this, the substrate W and the correcting member 7 are cleaned concurrently, so that a rate of operation of the substrate treatment apparatus 1 can be enhanced.

It is noted that the substrate treatment apparatus 1 may periodically perform a correcting process on the brush body 51 of the cleaning brush 5 by using the correcting member 7. Also, the substrate treatment apparatus 1 may clean substrates lot by lot, and perform a correcting process on the brush body 51 before or after a cleaning process of each lot.

Figure 12:
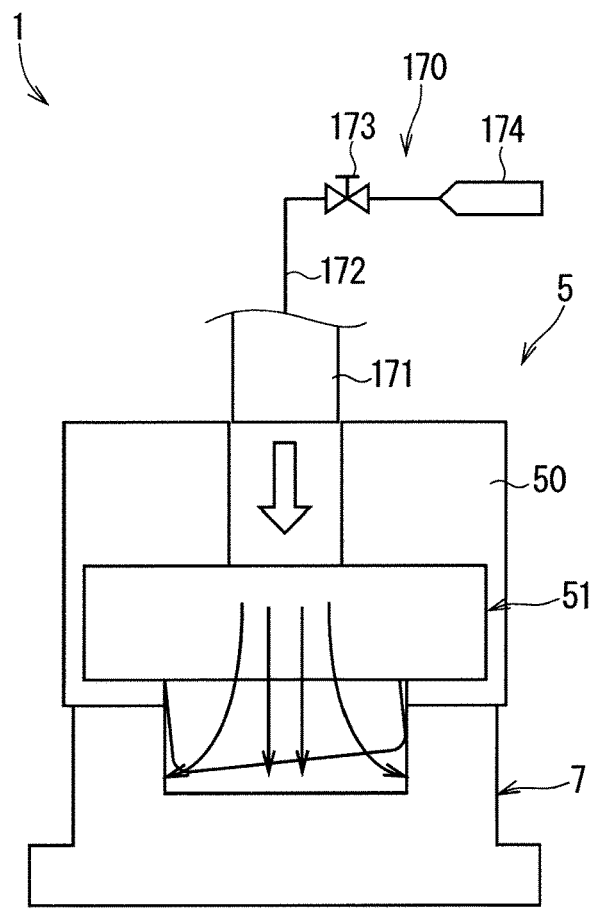
FIG. 12 is a cross-sectional view schematically showing an example of a cleaning brush connected to a fluid feeding mechanism.

FIG. 12 is a cross-sectional view schematically showing an example of the cleaning brush 5 connected to the fluid feeding mechanism 170. The substrate treatment apparatus 1 further includes the fluid feeding mechanism 170. The fluid feeding mechanism 170 includes a flow path 171 inserted into the brush holder 50 and the shaft 20, a pipe 172 connecting the flow path 171 to a fluid source 174, and an on/off valve 173 provided at some midpoint in a path of the pipe 172. In other words, the fluid feeding mechanism is a fluid feeder. The fluid source 174 can feed a predetermined fluid such as air, a nitrogen gas, helium, argon, or pure water, for example. Preferably, the fluid source 174 feeds a gas.

The brush body 51 has a spongy structure so that a fluid fed by the fluid source 174 can go through an inside of the brush body 51. The fluid feeding mechanism 170 feeds a predetermined fluid to the brush body 51 under the control of the controller 140, with the correcting member 7 being placed in a target position relative to the design brush 6. The fluid feeding mechanism 170 forms a flow of a predetermined fluid which goes toward the contact portion 75 of the correcting member 7 through an inside of the brush body 51. As a result of this, the brush body 51 swells, and so is pressed against the contact portion 75 of the correcting member 7. This allows a shape of the brush body 51 to be corrected so as to be close to a shape of the design brush 6.

Figure 13:
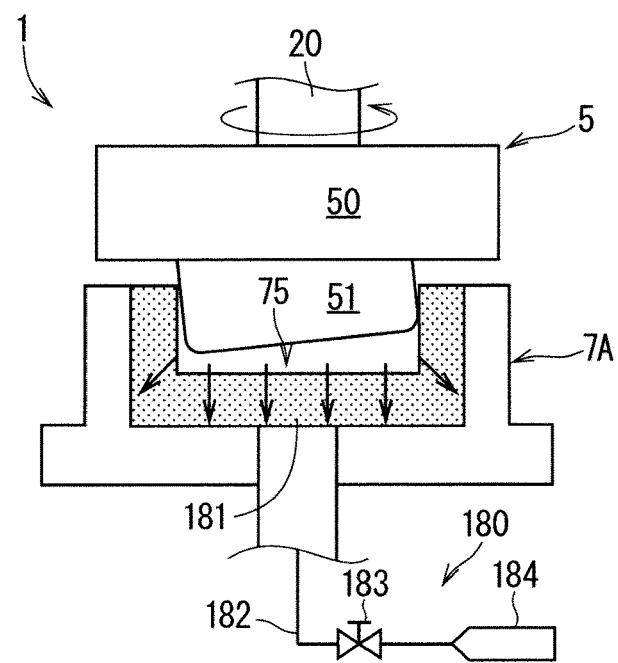
FIG. 13 is a cross-sectional view schematically showing an example of a correcting member connected to a decompressing mechanism.

FIG. 13 is a cross-sectional view schematically showing an example of a correcting member 7A connected to a decompressing mechanism 180. In the correcting member 7A, a suction flow path 181 is formed. The correcting member 7A has a bilayer structure along a thickness. In one of two layers which is provided near the contact portion 75, many small-diameter flow paths are formed. An end of each of the small-diameter flow paths opens to a surface of the contact portion 75, while the other end communicates with a flow path of a large-diameter pipe which passes through the other of the two layers of the correcting member 7A. The suction flow path 181 includes each of the small-diameter flow paths and the flow path of the large-diameter pipe. The substrate treatment apparatus 1 further includes the decompressing mechanism 180 which communicates with the suction flow path 181 and reduces a pressure in the suction flow path. The decompressing mechanism 180 includes the suction flow path 181, a pipe 182 communicating with the suction flow path 181, a decompressor 184 such as a vacuum pump which is connected to the pipe 182 and can reduce respective pressures in the pipe 182 and the suction flow path 181, and an on/off valve 183 interposed in the pipe 182. In other words, the decompressing mechanism is a decompressor.

A diameter of each of the small-diameter flow paths of the suction flow path 181 is set to be approximately 0.2 mm to 0.4 mm, for example. It is preferable that the many small-diameter flow paths are provided in a honeycomb pattern in order to prevent reduction in stiffness of the correcting member 7A. Also, it is preferable that many discharge outlets of the many small-diameter flow paths are provided uniformly over a whole of the contact portion 75.

Second Preferred Embodiment

Figure 14:
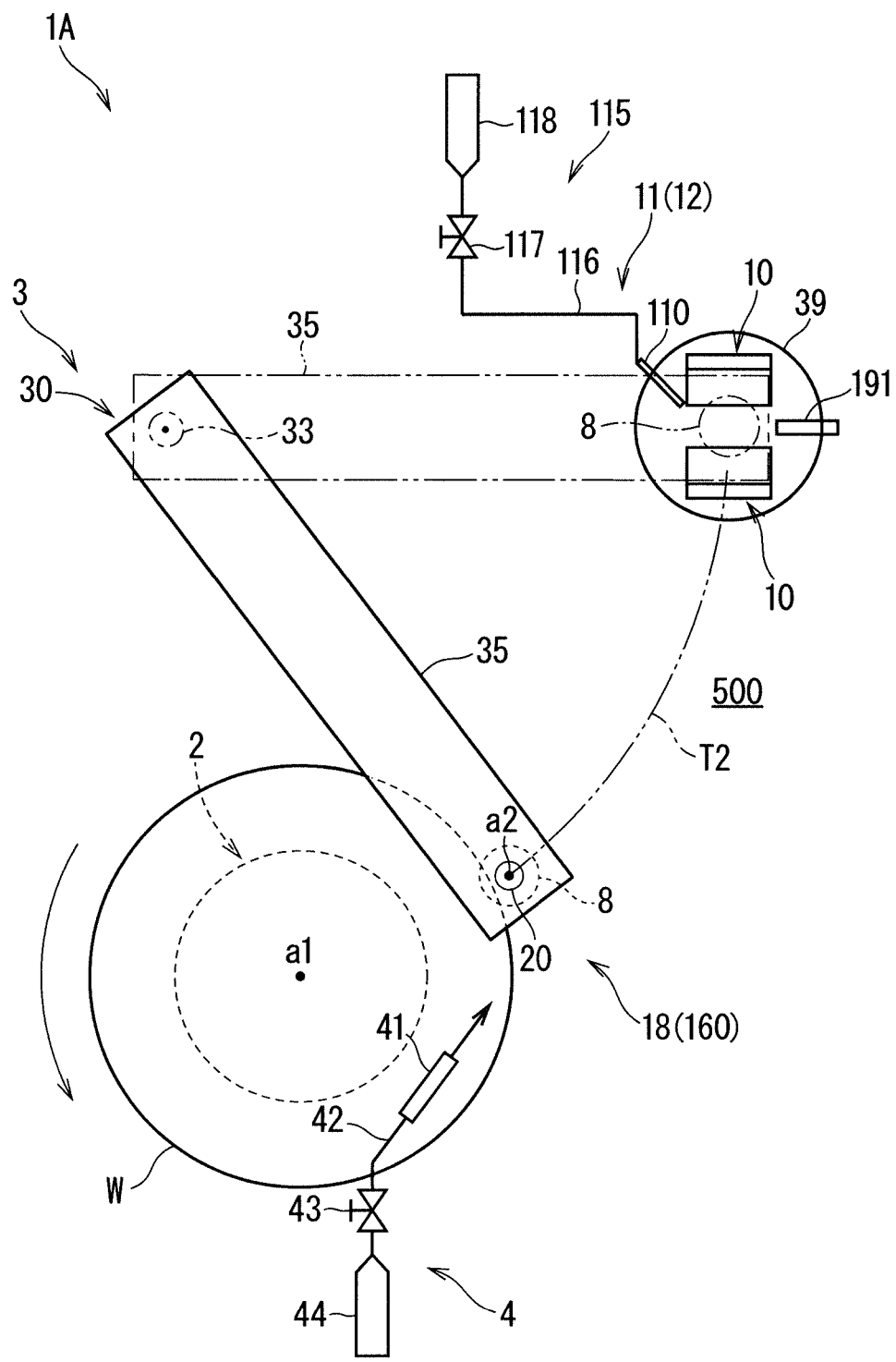
FIG. 14 is a plan view schematically showing an overall configuration of a substrate treatment apparatus according to a second preferred embodiment of the present invention.

FIG. 14 is a plan view schematically showing an overall configuration of a substrate treatment apparatus 1A according to a second preferred embodiment. In the substrate treatment apparatus 1A, in place of the cleaning brush 5 of the substrate treatment apparatus 1, a cleaning brush 8 used for cleaning an outer edge portion of the substrate W is attached to the shaft 20 of the arm 35. Also, in the standby pod 39, a correcting member 10 is provided in place of the correcting member 7 of the substrate treatment apparatus 1. In the other respects than described above, the substrate treatment apparatus 1A is configured in the same manner as the substrate treatment apparatus 1.

However, a change from the cleaning brush 5 used for cleaning an upper surface (main surface) of the substrate W, to the cleaning brush 8 results in a difference between a range in which the brush moving mechanism 3 of the substrate treatment apparatus 1A moves the cleaning brush 8 and a range in which the brush moving mechanism 3 of the substrate treatment apparatus 1 moves the cleaning brush 5. FIG. 14 shows an example in which the cleaning brush 8 is moved along a substantially arc-shaped path T2 which starts from a position above a standby position of the cleaning brush 8 (a position indicated by a circular chain double-dashed line) which is set outside a rotation range of the substrate W and runs above an outer edge portion of the substrate W. Also, the substrate treatment apparatus 1A includes the treatment-liquid feeding mechanism 4 which is configured in the same manner as that in the substrate treatment apparatus 1. In this regard, the treatment-liquid feeding mechanism 4 of the substrate treatment apparatus 1A is provided so as to feed a treatment liquid to an outer edge portion of the substrate W which is to be cleaned by the cleaning brush 5. An outer edge portion of the substrate W includes an annular area extending from an outer edge of the substrate W and having a width of approximately 1 mm to 3 mm, for example.

Also, in the substrate treatment apparatus 1, the brush moving mechanism 3 functions as the relatively-positioning mechanism 150. In contrast, because of inclusion of the correcting member 10 in the substrate treatment apparatus 1A, in place of the correcting member 7 of the substrate treatment apparatus 1, the substrate treatment apparatus 1A includes a relatively-positioning mechanism 150A (FIGS. 18 and 19) which is distinct from the brush moving mechanism 3.

The following description will deal with composing elements which are different from those in the substrate treatment apparatus 1, out of all of composing elements in the substrate treatment apparatus 1A, and description of composing elements configured in the same manner will be omitted.

<Cleaning Brush 8>

Figure 15:
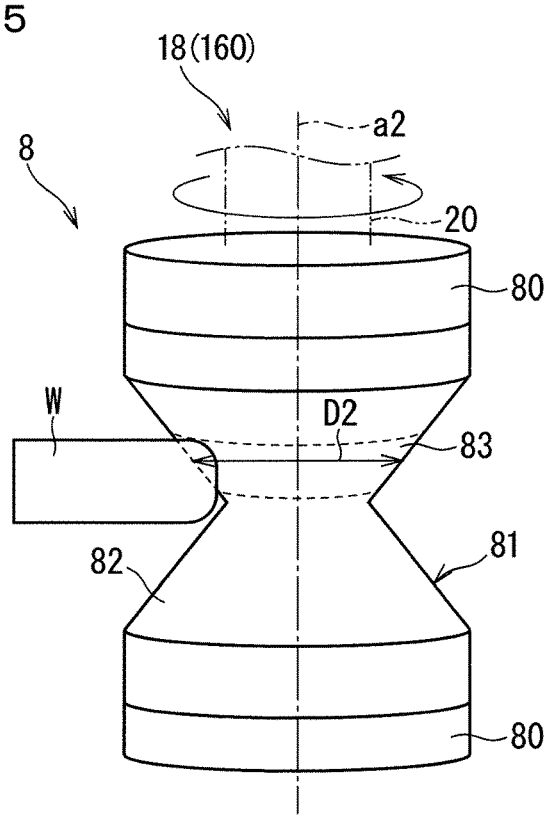
FIG. 15 is a perspective view schematically showing a cleaning brush in FIG. 14 which has a brush width of a design dimension.

FIG. 15 is a perspective view schematically showing the cleaning brush 8 having a brush width D2 (a dimension along a diameter of a substrate contact portion 83 which is to come into contact with an outer edge portion of the substrate W) which is a design dimension.

A brush body 81 of the cleaning brush 8 includes a pillar-shaped portion 82 which extends in a direction in which the shaft 20 (the center axis a2) extends. The brush body 81 is elastically deformable. The pillar-shaped portion 82 includes an inverted-frustum-shaped portion which tapers down toward a bottom in an upper portion thereof, and includes a frustum-shaped portion which becomes wider toward a bottom in a lower portion thereof. Each of the inverted-frustum-shaped portion and the frustum-shaped portion is a body of revolution which rotates about the center axis a2. A part of a belt-shaped annular side surface in a vertical direction (a direction along the center axis a2) in the inverted-frustum-shaped portion is the substrate contact portion 83 which can come into contact with an upper portion of an outer edge portion of the substrate W. Additionally, a part of a belt-shaped annular side surface (not shown) in a vertical direction in the frustum-shaped portion can be set as a substrate contact portion which can come into contact with a lower portion of an outer edge portion of the substrate W. Further, a central portion of the pillar-shaped portion 82 along the center axis a2 (a joint between the inverted-frustum-shaped portion and the frustum-shaped portion) includes a portion having the smallest brush width in the pillar-shaped portion 82. The substrate W may be cleaned in such a manner that an upper portion of the central portion is brought into contact with an upper portion of an outer edge portion of the substrate W and also a lower portion of the central portion is brought into contact with a lower portion of an outer edge portion of the substrate W.

Figure 16:
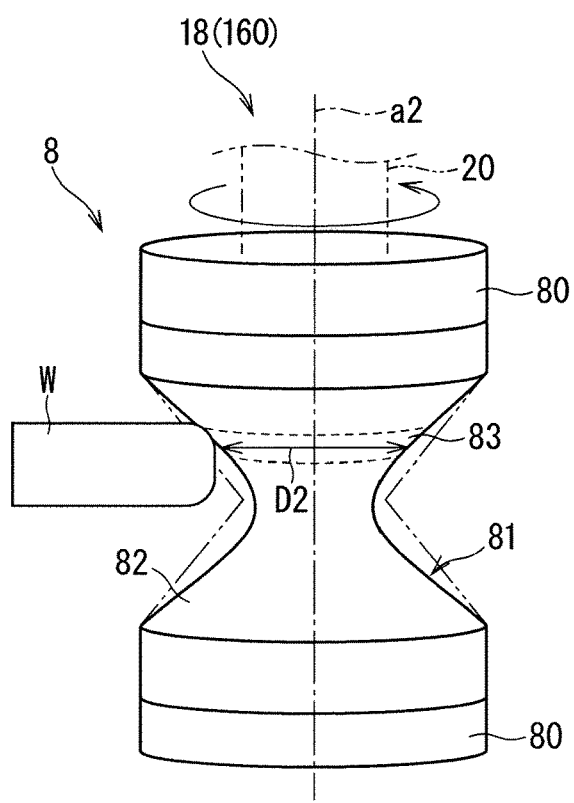
FIG. 16 is a perspective view schematically showing the cleaning brush in FIG. 14 in a case where the brush width is changed.

FIG. 16 is a perspective view schematically showing the cleaning brush 8 having the brush width D2 which is changed. The brush body 81 of the cleaning brush 8 is pressed against an outer edge portion of the substrate W being rotating, by the brush moving mechanism 3. The brush body 81 deforms for the reasons that the substrate W is harder than the brush body 81 and the substrate W rotates about the rotation axis a1, and for other like reasons. In an example in FIG. 16, the brush width D2 is smaller than a design dimension.

Figure 17:
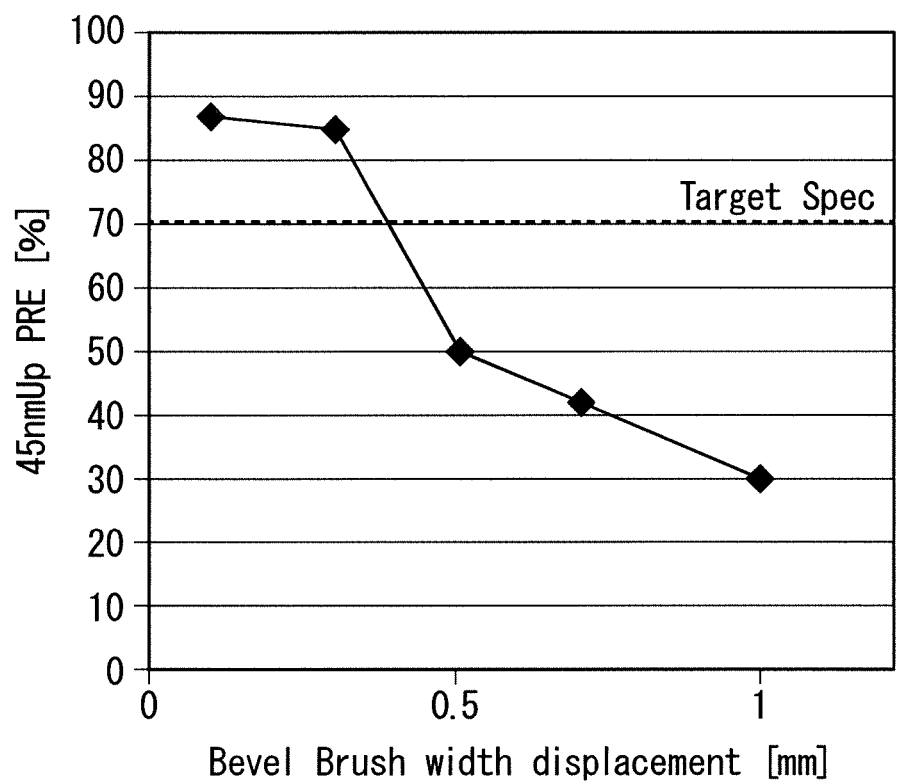
FIG. 17 is a view showing an example of a relationship between an amount of change in brush width and a proportion of removed particles, in a graph form.

FIG. 17 is a view showing an example of a relationship between an amount of change in the brush width D2 of the cleaning brush 8 and a proportion of removed particles each having a size of 45 nm or larger, in a graph form. In a case where a desired value of a proportion of removed particles is 70%, a proportion of removed particles falls below a desired value when an amount of change in the brush width D2 becomes larger than 0.4 mm.

<Design Brush 9 and Correcting Member 10>

Figure 18:
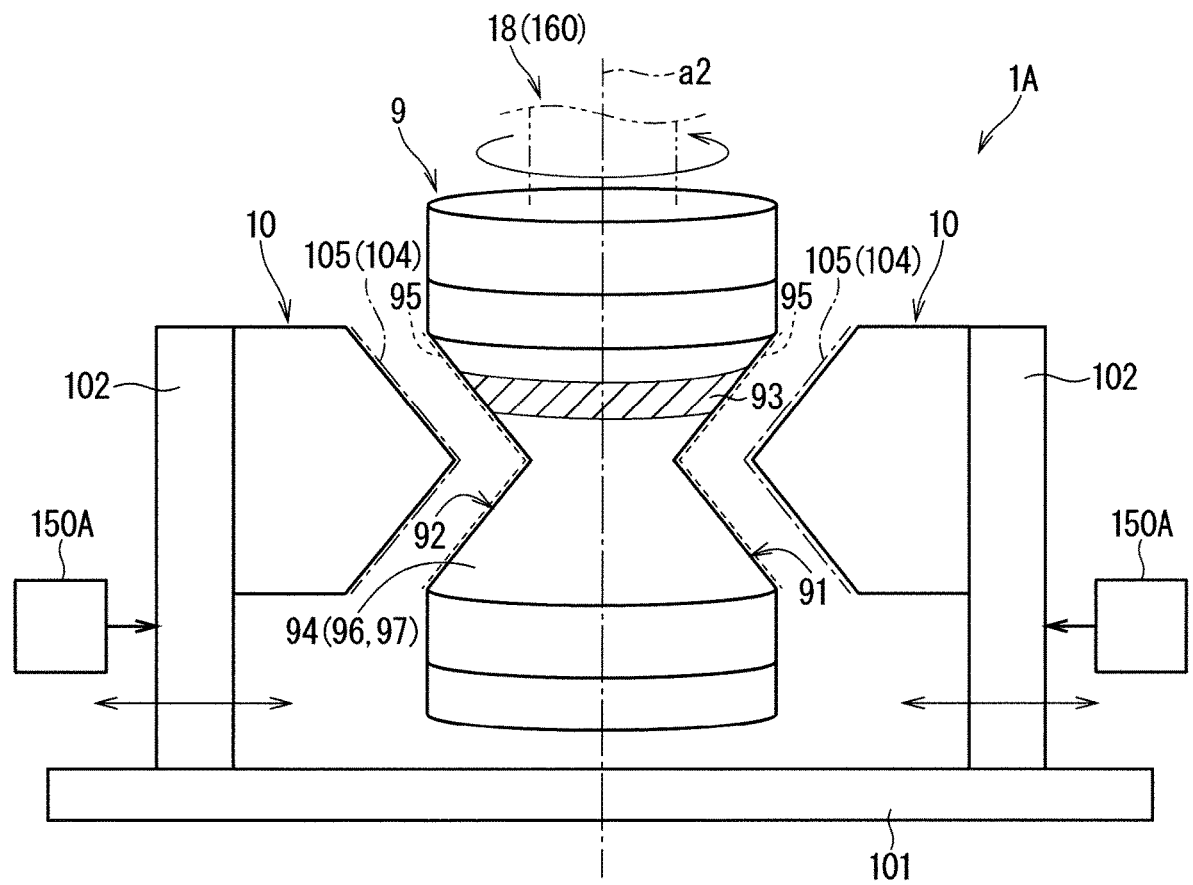
FIG. 18 is a schematic side view for explaining an example of a configuration of a design brush and a correcting member.
Figure 19:
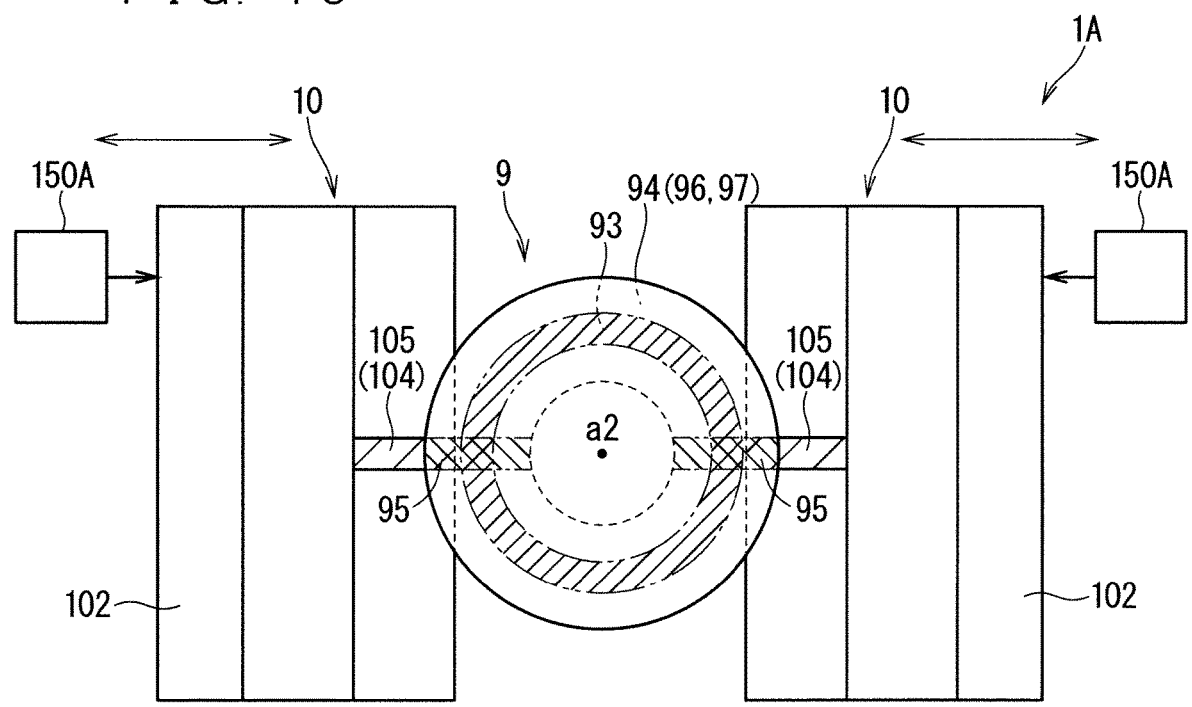
FIG. 19 is a schematic plan view showing the design brush and the correcting member in FIG. 18.

FIG. 18 is a schematic side view for explaining an example of a configuration of a design brush 9 and the correcting member 10. FIG. 19 is a schematic plan view schematically showing the design brush 9 and the correcting member 10. It is noted that though FIG. 18 and FIGS. 20 and 21 which will be later referred to are schematic side views, the design brush 9 (the cleaning brush 8) in those drawings is conveniently shown in perspective for easier recognition.

In FIGS. 18 and 19, the design brush 9 is a virtual cleaning brush which is attached to the shaft 20 in a predetermined manner, having a design shape of the cleaning brush 8. A design body 91 is a portion of the design brush 9, which corresponds to the brush body 81 of the cleaning brush 8. A design contact portion 93 is a portion of the design body 91, which corresponds to the substrate contact portion 83 of the brush body 81. A design pillar-shaped portion 92 is a portion of the design brush 9, which corresponds to the pillar-shaped portion 82 of the cleaning brush 8.

The correcting member 10 is a member which includes a contact portion 105 in an outer surface thereof. When the correcting member 10 is placed in a target position which is determined relatively to the design brush 9, the contact portion 105 comes into contact with an outer surface of the design body 91 of the design brush 9. In the substrate treatment apparatus 1A, a shape of the cleaning brush 8 is corrected with the correcting member 10 being placed in a target position by the relatively-positioning mechanism 150A. In other words, the relatively-positioning mechanism is a correcting member placer that places the correcting member at a target position relative to the cleaning brush.

The design brush 9 and the correcting member 10 according to the second preferred embodiment will be described about each of a third case, like the first case in the first preferred embodiment, where the cleaning brush 8 is corrected while being rotated about the center axis a2 of the shaft 20 relatively to the correcting member 10, and a fourth case, like the second case in the first preferred embodiment, where the cleaning brush 8 is corrected without being rotated relatively to the correcting member 10. Additionally, the correcting member 10 contains the same material as that of the correcting member 7.

<Design Brush 9 and Correcting Member 10 in the Third Case>

In the third case, an annular portion 94 which is a portion including the design contact portion 93 in a side surface of the design pillar-shaped portion 92 of the design brush 9 is a body of revolution 96 which rotates about the center axis a2. Also the design contact portion 93 is a belt-shaped body of revolution which rotates about the center axis a2. The annular portion 94 is a portion of the side surface of the design pillar-shaped portion 92, which includes the design contact portion 93. Also the annular portion 94 is a body of revolution.

When the correcting member 10 is placed in a target position, the contact portion 105 of the correcting member 10 overlaps an object portion 95 which is at least a part in a circumferential direction in a rotation path 97 of the body of revolution 96 being rotated relatively to the correcting member 10. The contact portion 105 is formed to have an inverted shape of the object portion 95 of the design brush 9, and is a center-axis facing surface 104 which faces the center axis a2 of the shaft 20.

<Design Brush 9 and Correcting Member 10 in the Fourth Case>

In the fourth case, the annular portion 94 which is a portion including the design contact portion 93 in a side surface of the design pillar-shaped portion 92 of the design brush 9 is not necessarily required to form a body of revolution about the center axis a2.

When the correcting member 10 is placed in a target position, the contact portion 105 of the correcting member 10 overlaps the object portion 95 which is a portion including the design contact portion 93 in a side surface of the design pillar-shaped portion 92 of the design brush 9. The contact portion 105 is formed to have an inverted shape of the object portion 95 of the design brush 9, and is the center-axis facing surface 104 which faces the center axis a2 of the shaft 20.

FIGS. 18 and 19 are a schematic side view and a schematic plan view, respectively, for explaining an example of a configuration of the design brush 9 and the correcting member 10 for the third case.

The design body 91 of the design brush 9 includes the design pillar-shaped portion 92 which extends in a direction in which the shaft 20 (center axis a2) extends. The design pillar-shaped portion 92 includes an inverted-frustum-shaped portion which tapers down toward a bottom in an upper portion thereof, and includes a frustum-shaped portion which becomes wider toward a bottom in a lower portion thereof. Each of the inverted-frustum-shaped portion and the frustum-shaped portion is a body of revolution which rotates about the center axis a2. A part of a belt-shaped annular side surface in a vertical direction (a direction along the center axis a2) in the inverted-frustum-shaped portion is the design contact portion 93 which can come into contact with an upper portion of an outer edge portion of the substrate W.

Figure 23:
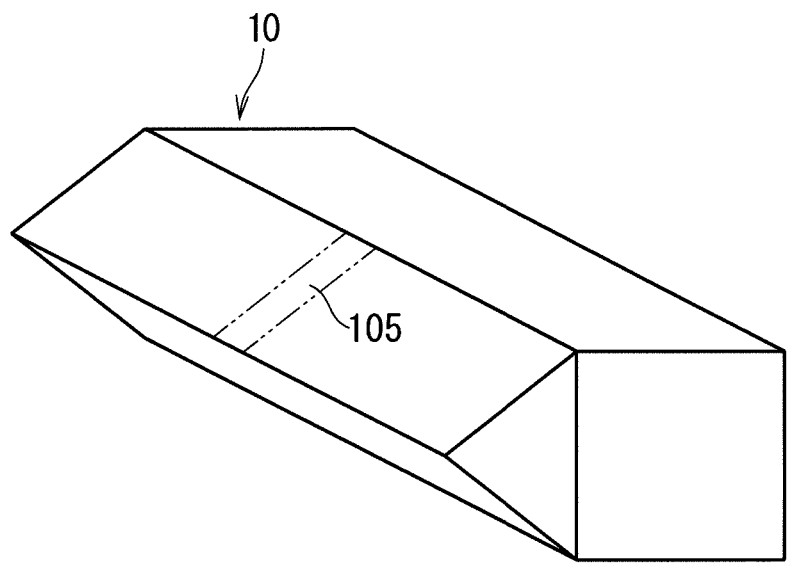
FIGS. 23, 24 and 25 are perspective views each showing an example of a correcting member.

FIG. 23 is a perspective view showing the correcting member 10. The correcting member 10 has a pentagonal section, and is a pillar-shaped member extending horizontally. The pillar-shaped member of the correcting member 10 has a shape obtained by extension of a bent contour of one side surface in a vertical section of the inverted-frustum-shaped portion and the frustum-shaped portion of the design brush 9, in a direction perpendicular to the vertical section. The correcting member 10 includes an upwardly-inclined surface and a downwardly-inclined surface. A belt-shaped portion which extends in a vertical direction along the foregoing bent contour in the upwardly-inclined surface and the downwardly-inclined surface is the contact portion 105, and is also the center-axis facing surface 104.

In the standby pod 39, a flat plate 101 in a horizontal posture is provided, and a pair of parallel flat plates 102 are erected in a vertical posture, from an upper surface of the flat plate 101. The correcting member 10 is attached to each of opposite surfaces of the pair of flat plates 102. The pair of correcting members 10 is attached to the pair of flat plates 102 so that respective top portions face each other.

The pair of flat plates 102 is provided so that a distance therebetween is variable while being kept parallel to each other. When the relatively-positioning mechanism 150A places the pair of correcting members 10 in respective target positions with the design brush 9 (the cleaning brush 8) being placed in a retraction position in the standby pod 39 by the brush moving mechanism 3, the respective contact portions 105 of the correcting members 10 overlap the object portions 95 of the design brush 9, respectively.

<Relatively-Positioning Mechanism 150A>

The relatively-positioning mechanism 150A is a mechanism which moves the correcting member 10 relatively to the design brush 9 (the cleaning brush 8), to thereby place the correcting member 10 in a target position determined relatively to the design brush 9. In an example shown in FIGS. 18 and 19, the pair of correcting members 10 is attached to the pair of flat plates 102, and the relatively-positioning mechanism 150A moves the pair of flat plates 102, to thereby move the pair of correcting members 10 integrally with the pair of flat plates 102. More specifically, the relatively-positioning mechanism 150A includes a movement stage provided between the flat plate 101 and each of the flat plates 102, for example. When the brush moving mechanism 3 moves the cleaning brush 8 to a retraction position in the standby pod 39, or moves the cleaning brush 8 out of the standby pod 39 from a retraction position, the relatively-positioning mechanism 150A sets a distance between the pair of correcting members 10 so as not to hinder movement of the cleaning brush 8. With the cleaning brush 8 being placed in a retraction position in the standby pod 39 by the brush moving mechanism 3, the relatively-positioning mechanism 150A moves each of the correcting members 10 to a target position under the control of the controller 140. As a result of this, a shape of the cleaning brush 8 is corrected to be close to a shape of the design brush 9.

Figure 20:
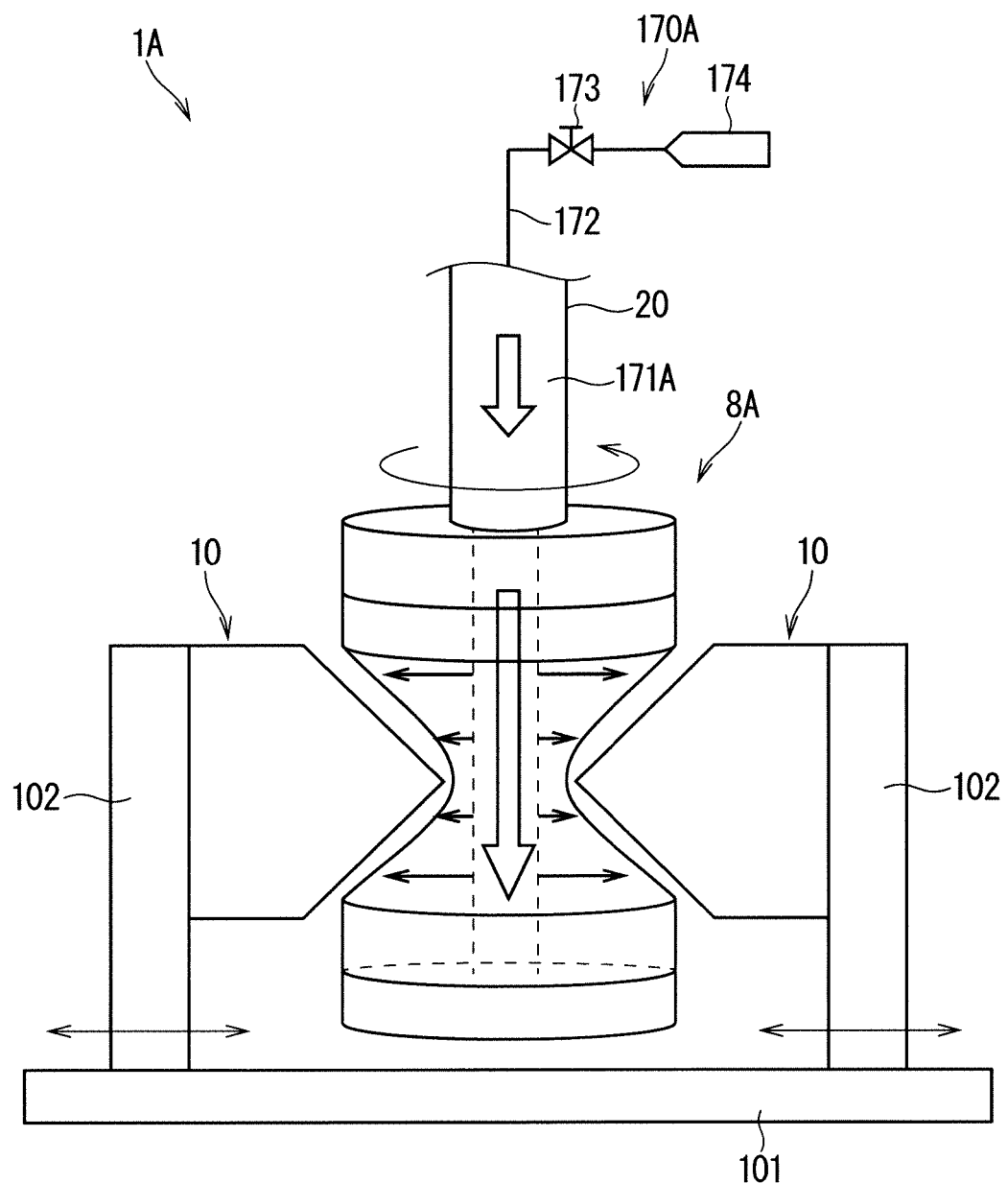
FIG. 20 is a side view schematically showing an example of a cleaning brush connected to a fluid feeding mechanism.

FIG. 20 is a side view schematically showing an example of a cleaning brush 8A connected to a fluid feeding mechanism 170A. The cleaning brush 8A, like the cleaning brush 8, is used for cleaning an outer edge portion of the substrate W. The cleaning brush 8A is placed in a retraction position by the brush moving mechanism 3, and the pair of correcting members 10 is placed in respective target positions. The cleaning brush 8A includes a pipe passing through the cleaning brush 8A along a center axis thereof. Many through holes which communicate with a flow path in the pipe are provided in a side surface of the pipe, and a fluid such as air which is fed to the pipe is fed to a brush body of the cleaning brush 8A through the through holes. The fluid feeding mechanism 170A feeds a predetermined fluid to the brush body of the cleaning brush 8A, to form fluid flows which go toward the contact portions 105 of the correcting members 10 through an inside of the brush body. As a result of this, the brush body of the cleaning brush 8A is pressed against the contact portions 105, so that a shape of the cleaning brush 8A is corrected. The fluid feeding mechanism 170A, like the fluid feeding mechanism 170 of the substrate treatment apparatus 1, includes a fluid source 174, a pipe 172 connected to the fluid source 174, an on/off valve 173 provided at some midpoint in the pipe 172, a flow path 171A which is connected to the pipe 172 and is provided within the shaft 20, and a pipe which is connected to the flow path 171A and is provided within the cleaning brush 8A.

Figure 21:
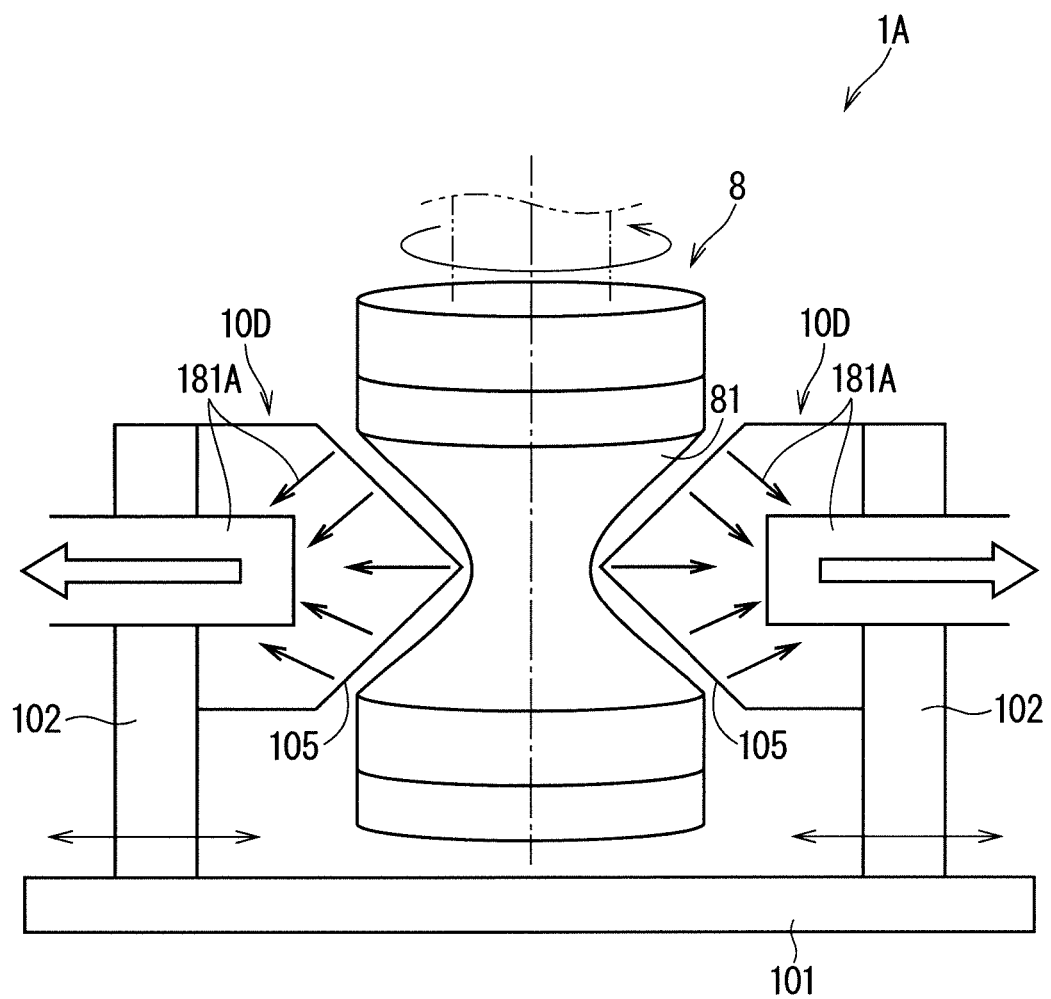
FIG. 21 is a cross-sectional view schematically showing an example of a correcting member connected to a decompressing mechanism.

FIG. 21 is a cross-sectional view schematically showing a correcting member 10D as an example of a correcting member connected to a decompressing mechanism. In the correcting member 10D, a suction flow path 181A which opens to the contact portion 105 is formed. The suction flow path 181A includes many branch pipes which open to the contact portion 105, and a large-diameter pipe which communicates with each of the branch pipes. The large-diameter pipe passes through the flat plate 102. The large-diameter pipe communicates with a decompressing mechanism not shown which includes a vacuum pump or the like. When the decompressing mechanism reduces a pressure in the suction flow path 181A, the brush body 81 of the cleaning brush 8 is pulled out toward the contact portion 105 of the correcting member 10D. As a result of this, a shape of the brush body 81 is corrected to be identical to a shape of the contact portion 105.

As shown in FIG. 14, the substrate treatment apparatus 1A includes the brush cleaning mechanism 11 which is configured in the same manner as that in the substrate treatment apparatus 1. The brush cleaning mechanism 11 includes the nozzle 110 which discharges a cleaning liquid to the brush body 81 of the cleaning brush 8, and the cleaning-liquid feeding mechanism 115 which communicates with the nozzle 110 and feeds a cleaning liquid (carbonated water, pure water, or the like, for example) to the nozzle 110. The brush cleaning mechanism 11 can feed a cleaning liquid to the brush body 81 of the cleaning brush 8 and clean the brush body 81 with the correcting member 10 being placed in a target position.

The brush cleaning mechanism 11 is configured to be operable also as the correcting-member cleaning mechanism 12 which feeds a cleaning liquid to the correcting member 10 and cleans the correcting member 10. It is noted that the brush cleaning mechanism 11 and the correcting-member cleaning mechanism 12 may be provided as mechanisms distinct from each other. In other words, the correcting-member cleaning mechanism is a correcting member cleaner. The correcting-member cleaning mechanism 12 feeds a cleaning liquid to the contact portion 105 and cleans the contact portion 105 with the correcting member 10 being at some distance from a target position and with the contact portion 105 of the correcting member 10 being exposed.

FIG. 22 is a top view schematically showing an example of arrangement of a plurality of nozzles 110 which feed a cleaning liquid to the cleaning brush 8 being corrected. While the brush cleaning mechanism 11 includes a single nozzle 110 in the example in FIG. 14, the brush cleaning mechanism 11 may include a plurality of (two in the example shown in FIG. 22) nozzles 110 as shown in FIG. 22. In FIG. 22, the pair of correcting members 10 is placed in respective target positions, and correct a shape of the cleaning brush 8. The plurality of nozzles 110 are provided along a direction of rotation of the cleaning brush 8 with one of the correcting members 10 being interposed therebetween. A discharge outlet of each of the nozzles is provided so as to directly face the brush body 81 of the cleaning brush 8. Because of the foregoing configuration, a cleaning liquid is fed to plural portions along a circumference of the brush body 81 while a shape of the brush body 81 being rotated about the center axis a2 is corrected by the correcting members 10, so that the brush body 81 can be efficiently cleaned.

Figure 26:
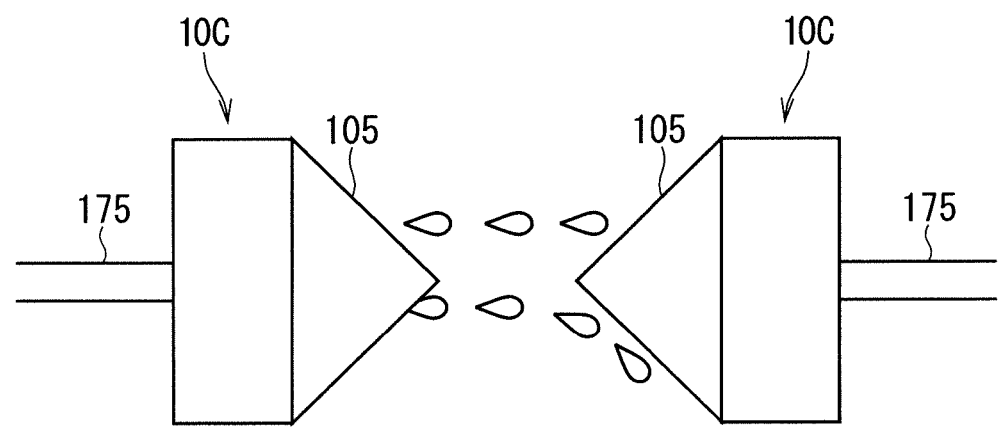
FIG. 26 is a schematic side view for explaining an example of a cleaning method for a correcting member.
Figure 27:
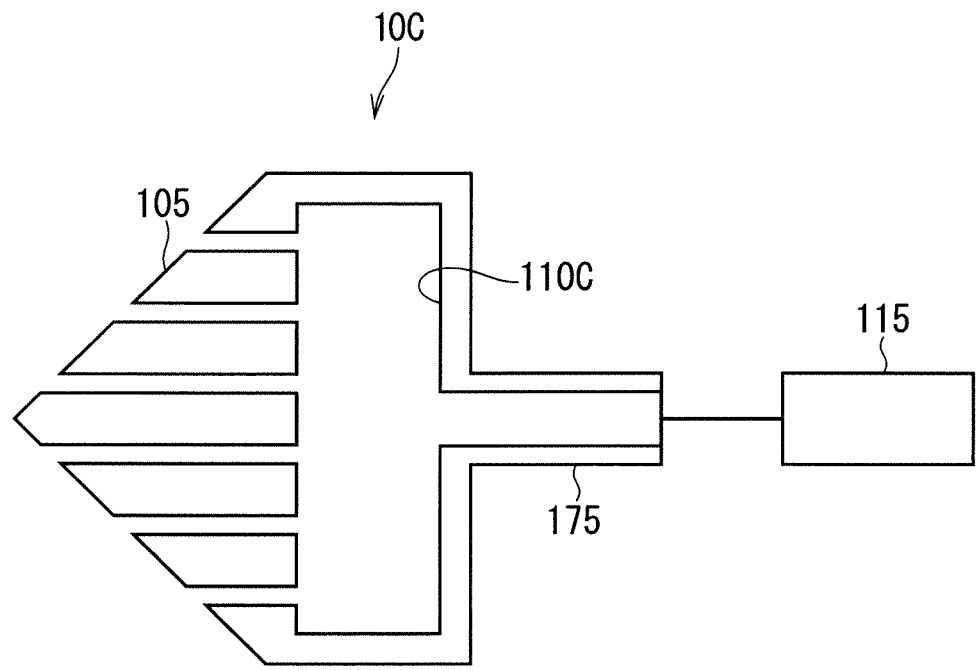
FIG. 27 is a cross-sectional view of a side surface, schematically showing an example of a configuration of the correcting member in FIG. 26.

FIG. 26 is a schematic side view for explaining an example of a method of cleaning a correcting member 10C used for correcting a shape of the cleaning brush 8. FIG. 27 is a cross-sectional view of a side surface, schematically showing an example of a configuration of the correcting member 10C. Though a cleaning liquid is fed to the correcting member 10 from the nozzle 110 which is separately provided in the example in FIG. 22, each of the pair of correcting members 10C in FIG. 22 can be cleaned with a cleaning liquid which is discharged from the other of correcting members 10C. As shown in FIG. 27, in the correcting member 10C, a liquid reservoir cavity 110C is formed, and a plurality of flow paths which communicate with the liquid reservoir cavity 110C and open to the contact portion 105 are formed. The liquid reservoir cavity 110C is connected to a pipe 175, with which the cleaning-liquid feeding mechanism 115 shown in FIG. 14 communicates. A cleaning liquid fed by the cleaning-liquid feeding mechanism 115 is introduced into the liquid reservoir cavity 110C in the correcting member 10C through the pipe 175, flows through the flow paths from the liquid reservoir cavity 110C, and is discharged toward the contact portion 105 of the other correcting member 10C from a discharge outlet of each of the flow paths. Accordingly, each of the pair of the correcting members 10C can clean the contact portion 105 of the other correcting member 10C without additional provision of a nozzle dedicated to cleaning.

Figure 24:
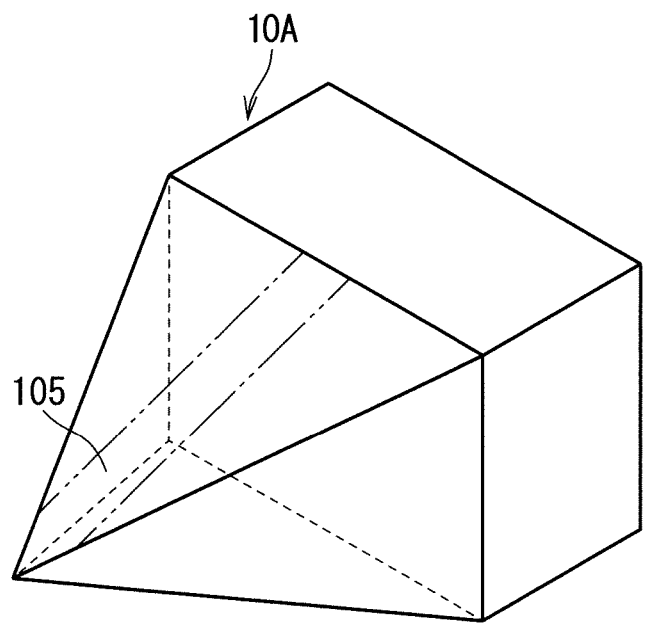
Figure 25:
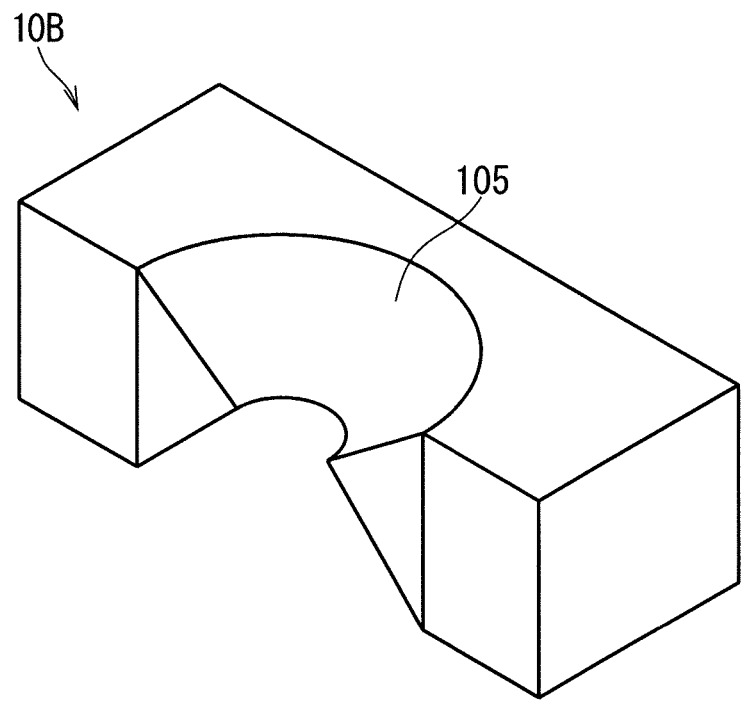

FIGS. 24 and 25 are perspective views showing correcting members 10A and 10B, respectively, as examples of correcting members used for correcting a shape of the cleaning brush 8.

In the correcting member 10A, a portion at a tip which faces the cleaning brush 8 when the correcting member 10A is placed in a target position, is formed to have a shape of a quadrangular pyramid. Even if the correcting member 10A is adopted, the contact portion 105 of the correcting member 10A can be brought into contact with the substrate contact portion 83 of the cleaning brush 8 by rotation of the cleaning brush 8 about the center axis a2. As a result of this, a shape of the brush body 81 of the cleaning brush 8 can be corrected by the correcting member 10A.

The correcting member 10B includes a portion which faces the cleaning brush 8 when the correcting member 10B is placed in a target position. In the portion, a semicircle's arc-shaped portion which extends along a circumference of the cleaning brush 8 is formed. A cross section of the semicircle's arc-shaped portion in each position along a circumference has a shape of a triangle which points a vertex thereof toward a narrowed portion of the brush body 81 of the cleaning brush 8. A portion above a central portion in a vertical direction in a surface of the semicircle's arc-shaped portion has a shape of a mortar, a diameter of which increases toward a top, and a portion below the central portion is formed to have a shape of a mortar, a diameter of which increases toward a bottom. A whole of a surface of the semicircle's arc-shaped portion is the contact portion 105 of the correcting member 10B. A shape of the cleaning brush 8 may be corrected by the pair of correcting members 10B which is set so that respective semicircle's arc-shaped portions face each other.

Also, though the pair of correcting members 10 is adopted in the example in FIG. 14, a shape of the cleaning brush 8 may be corrected by only one of the pair of correcting members 10. Further, a structure of the brush body 51 of the cleaning brush 5, the brush body 81 of the cleaning brush 8, or the like is not limited to a spongy structure.

In the substrate treatment apparatus according to the first preferred embodiment which is configured as described above, in a case where the apparatus is applied to the above-described second case, the brush body 51 of the cleaning brush 5 includes the substrate contact portion 53 which forms an end surface of the pillar-shaped portion 52 extending in a direction in which the shaft 20 extends. The design brush 6 has a design shape of the cleaning brush 5. The object portion 65 is a portion which is a combination of the design contact portion 63 corresponding to the substrate contact portion 53 in an outer surface of the design brush 6, and the belt-shaped annular portion 64 extending from an outer edge of the design contact portion 63 in a direction in which the shaft 20 extends. Then, when the correcting member 7 is placed in a target position, the contact portion 75 of the correcting member 7 overlaps the object portion 65. The contact portion 75 is formed to have an inverted shape of the object portion 65, and a portion of the contact portion 75, which corresponds to the belt-shaped annular portion 64, is the center-axis facing surface 74 which faces the center axis a2 of the shaft 20. Accordingly, when the correcting member 7 is placed in a target position, the substrate contact portion 53 of the cleaning brush 5 is restrained from expanding by the center-axis facing surface 74 of the correcting member 7. As a result of this, variation in size of the substrate contact portion 53 can be reduced.

Also, in the substrate treatment apparatus according to the first preferred embodiment, in a case where the apparatus is applied to the above-described first case, the brush body 51 of the cleaning brush 5 includes the substrate contact portion 53 which forms an end surface of the pillar-shaped portion 52 extending in a direction in which the shaft 20 extends. The design brush 6 has a design shape of the cleaning brush 5. The cleaning brush 5 is rotated about the center axis a2 of the shaft 20 relatively to the correcting member 7. A portion which is a combination of the design contact portion 63 of the design brush 6 and the belt-shaped annular portion 64 extending from an outer edge of the design contact portion 63 is the body of revolution 66 rotating about the center axis a2 of the shaft 20. The object portion 65 is a combination of at least a part in a circumferential direction in a portion corresponding to the belt-shaped annular portion 64 in the rotation path 67 of the body of revolution 66, and a portion of the rotation path 67, which corresponds to the design contact portion 63. Then, when the correcting member 7 is placed in a target position, the contact portion 75 of the correcting member 7 overlaps the object portion 65. The contact portion 75 is formed to have an inverted shape of the object portion 65, and a portion of the contact portion 75, which corresponds to the belt-shaped annular portion 64, is the center-axis facing surface 74 which faces the center axis a2 of the shaft 20. Accordingly, when the correcting member 7 is placed in a target position, the substrate contact portion 53 of the cleaning brush 5 is restrained from expanding by the center-axis facing surface 74 of the correcting member 7. As a result of this, variation in size of the substrate contact portion 53 can be reduced.

Also, in the substrate treatment apparatus according to the first preferred embodiment, in a case where the apparatus is applied to the above-described first case, the cleaning brush 5 is rotated about the center axis a2 of the shaft 20 relatively to the correcting member 7, so that the substrate contact portion 53 of the cleaning brush 5 is more forcibly restrained from expanding by the center-axis facing surface 74 of the correcting member 7.

Also, in the substrate treatment apparatus according to the second preferred embodiment which is configured in the above-described manner, in a case where the apparatus is applied to the above-described fourth case, the brush body 81 of the cleaning brush 8 includes the substrate contact portion 83 in a side surface of the pillar-shaped portion 82 extending in a direction in which the shaft 20 extends. The design brush 9 has a design shape of the cleaning brush 8. The object portion 95 is a portion including the design contact portion 93 corresponding to the substrate contact portion 83, in a side surface of the design pillar-shaped portion 92 of the design brush 9, which corresponds to the pillar-shaped portion 82. Then, when the correcting member 10 is placed in a target position, the contact portion 105 of the correcting member 10 overlaps the object portion 95. The contact portion 105 is formed to have an inverted shape of the object portion 95 of the design brush 9, and is the center-axis facing surface 104 which faces the center axis a2 of the shaft 20. Accordingly, when the correcting member 10 is placed in a target position, the substrate contact portion 83 of the cleaning brush 8 is restrained from expanding by the center-axis facing surface 104 of the correcting member 10. As a result of this, variation in size of the substrate contact portion 83 can be reduced.

Also, in the substrate treatment apparatus according to the second preferred embodiment, in a case where the apparatus is applied to the above-described third case, the brush body 81 of the cleaning brush 8 includes the substrate contact portion 83 in a side surface of the pillar-shaped portion 82 extending in a direction in which the shaft 20 extends. The design brush 9 has a design shape of the cleaning brush 8. The cleaning brush 8 is rotated about the center axis a2 of the shaft 20 relatively to the correcting member 10. The annular portion 94 including the design contact portion 93 in a side surface of the design pillar-shaped portion 92 of the design brush 9 is the body of revolution 96 rotating about the center axis a2 of the shaft 20. The object portion 95 in the design brush 9 is at least a part in a circumferential direction in the rotation path 97 of the body of revolution 96. When the correcting member 10 is placed in a target position, the contact portion 105 of the correcting member 10 overlaps the object portion 95. The contact portion 105 is formed to have an inverted shape of the object portion 95 of the design brush 9, and is the center-axis facing surface 104 which faces the center axis a2 of the shaft 20. Accordingly, when the correcting member 10 is placed in a target position, the substrate contact portion 83 of the cleaning brush 8 is restrained from expanding by the center-axis facing surface 104 of the correcting member 10. As a result of this, variation in size of the substrate contact portion 83 can be reduced.

Also, in the substrate treatment apparatus according to the second preferred embodiment, in a case where the apparatus is applied to the above-described third case, the cleaning brush 8 is rotated about the center axis a2 of the shaft 20 relatively to the correcting member 10, so that the substrate contact portion 83 of the cleaning brush 8 is more forcibly restrained from expanding by the center-axis facing surface 104 of the correcting member 10.

Also, in the substrate treatment apparatuses according to the first and second preferred embodiments, each of the brush bodies 51 and 81 has a spongy structure, and the fluid feeding mechanism feeds a predetermined fluid to the brush body 51 or 81 of the cleaning brush 5 of 8, to form a flow of the predetermined fluid which goes toward the contact portion 75 or 105 of the correcting member 7 or 10 through an inside of the brush body 51 or 81, with the correcting member 7 or 10 being placed in a target position relative to the design brush 6 or 9. Accordingly, even in a case where a portion of the brush body 51 or 81, which faces the contact portion 75 or 105 of the correcting member 7 or 10, shrinks, the brush body 51 or 81 can be swelled by the fluid, to be pressed against the contact portion 75 or 105, so that a shape of the portion facing the contact portion 75 or 105 can be made close to a shape of the contact portion 75 or 105.

Also, in the substrate treatment apparatuses according to the first and second preferred embodiments, the suction flow path 181 or 181A which opens to the contact portion 75 or 105 is formed in the correcting member 7 or 10, and the substrate treatment apparatus further includes the decompressing mechanism which communicates with the suction flow path 181 or 181A and reduces a pressure in the suction flow path 181 or 181A. Thus, when the decompressing mechanism reduces a pressure in the suction flow path 181 or 181A with the correcting member 7 or 10 being placed in a target position relative to the design brush 6 or 9, a portion of the brush body 51 or 81 of the cleaning brush 5 of 8, which faces the contact portion 75 or 105, is pulled out toward the contact portion 75 or 105 by reduction of a pressure in the suction flow path 181 or 181A, so that a shape of the portion facing the contact portion 75 or 105 can be made close to a shape of the contact portion 75 or 105, even in a case where the portion facing the contact portion 75 or 105 shrinks.

Also, in the substrate treatment apparatuses according to the first and second preferred embodiments, further included is the correcting-member cleaning mechanism 12 which feeds a cleaning liquid to the contact portion 75 or 105 of the correcting member 7 or 10 and clean the contact portion 75 or 105, with the correcting member 7 or 10 being at some distance from a target position. Accordingly, cleaning of the contact portion 75 or 105 can be performed concurrently with a cleaning process of the substrate W which is performed with the cleaning brush 5 or 8, so that a throughput of the substrate treatment apparatus can be improved.

Also, in the substrate treatment apparatuses according to the first and second preferred embodiments, further included is the brush cleaning mechanism 11 which can feed a cleaning liquid to the brush body 51 or 81 of the cleaning brush 5 or 8 and clean the brush body 51 or 81 with the correcting member 7 or 10 being placed in a target position. Accordingly, the brush body 51 or 81 of the cleaning brush 5 or 8 can be cleaned while a shape of the brush body 51 or 81 is corrected by the correcting member 7 or 10.

Also, in the substrate treatment apparatuses according to the first and second preferred embodiments, the correcting-member cleaning mechanism 12 is configured to be capable of feeding a cleaning liquid to the brush body 51 or 81 of the cleaning brush 5 or 8 and cleaning the brush body 51 or 81 with the correcting member 7 or 10 being placed in a target position. Accordingly, there is no need of providing a cleaning mechanism dedicated to cleaning of the brush body 51 or 81, so that a configuration of the apparatus can be simplified.

Also, in the substrate treatment apparatuses according to the first and second preferred embodiments, the measurement instrument 191 which measures an amount of deformation of the brush body 51 or 81 of the cleaning brush 5 or 8 is further included. Accordingly, if an amount of deformation exceeds a predetermined reference amount, the substrate treatment apparatus can give an alarm, a message advising replacement of the cleaning brush 5 or 8, or the like, for example.

While the invention has been shown and described in detail, the foregoing description is in all aspects illustrative and not restrictive. It is therefore understood that numerous modifications and variations can be devised without departing from the scope of the invention.

What is claimed is:

1. A substrate treatment apparatus comprising:
   a rotatable substrate holder configured to hold a substrate in a horizontal posture and rotate the substrate about a rotation axis which vertically passes through a center of said substrate;
   a cleaning brush including a brush body which is elastically deformable;
   a brush mover including a shaft to which said cleaning brush is attached, the shaft extending in a direction transverse to a main surface of said substrate, and the brush mover being configured to move said cleaning brush by moving said shaft,
   a flat plate in a horizontal posture;
   a pair of parallel flat plates that are erected from said flat plate to be movable in a horizontal direction;
   a pair of brush shapers that are attached to each of opposite surfaces of said pair of flat plates so as to face each other;
   a contact portion that is convex-shaped in a horizontal direction and provided on a side surface of said pair of brush shapers; and
   a placer for placing the brush shapers configured to place said pair of brush shapers in a target position by moving said pair of parallel flat plates in a horizontal direction on said flat plate, wherein
   said brush body includes a pillar-shaped portion extending in a direction in which said shaft extends, and includes a substrate contact portion which is configured to come into contact with said substrate, in a side surface of said pillar-shaped portion; and
   said brush mover is capable of bringing said substrate contact portion of said brush body into contact with an outer edge portion of said substrate.

2. The substrate treatment apparatus according to claim 1, wherein
   said brush body has a spongy structure,
   said substrate treatment apparatus further comprising:
   a fluid feeder configured to feed a predetermined fluid to said brush body of said cleaning brush with said pair of brush shapers being placed in said target position, and form a flow of said fluid which goes toward said contact portion of said pair of brush shapers through an inside of said brush body.

3. The substrate treatment apparatus according to claim 1, wherein
   a suction flow path which opens to said contact portion is formed in said pair of brush shapers,
   said substrate treatment apparatus further comprising:
   a decompressor which communicates with said suction flow path and is configured to reduce a pressure in said suction flow path.

4. The substrate treatment apparatus according to claim 1, further comprising:
   a correcting-member cleaner configured to feed a cleaning liquid to said contact portion of said pair of brush shapers and clean said contact portion with pair of said brush shapers being at some distance from said target position.

5. The substrate treatment apparatus according to claim 4, wherein
   said correcting-member cleaner is configured to be capable of feed a cleaning liquid to said brush body of said cleaning brush and cleaning said brush body with said pair of brush shapers being placed in said target position.

6. The substrate treatment apparatus according to claim 1, further comprising:
   a brush cleaner configured to feed a cleaning liquid to said brush body of said cleaning brush and cleaning said brush body with said pair of brush shapers being placed in said target position.

7. The substrate treatment apparatus according to claim 1, further comprising:
   a size measuring device configured to measure an amount of deformation of said brush body of said cleaning brush.

8. A substrate treatment apparatus comprising:
   a rotatable substrate holder configured to hold a substrate in a horizontal posture and rotate the substrate about a rotation axis which vertically passes through a center of said substrate;

a cleaning brush including a brush body which is elastically deformable;

a brush moving mechanism brush mover including a shaft to which said cleaning brush is attached, the shaft extending in a direction transverse to a main surface of said substrate, and the brush mover being configured to move said cleaning brush by moving said shaft, a flat plate in a horizontal posture;

a pair of parallel flat plates that are erected from said flat plate to be movable in a horizontal direction;

a pair of brush shapers that are attached to each of opposite surfaces of said pair of flat plates so as to face each other;

a contact portion that is convex-shaped in a horizontal direction and provided on a side surface of said pair of brush shapers;

a correcting member placer configured to place said pair of brush shapers in a target position by moving said pair of parallel flat plates in a horizontal direction on said flat plate; and a brush rotator configured to rotate said cleaning brush about a center axis of said shaft relatively to said pair of brush shapers, wherein said brush body includes a pillar-shaped portion extending in a direction in which said shaft extends, and includes a substrate contact portion which is configured to come into contact with said substrate, in a side surface of said pillar-shaped portion;

said brush mover is capable of bringing said substrate contact portion of said brush body into contact with an outer edge portion of said substrate.

9. The substrate treatment apparatus according to claim 8, wherein said brush body has a spongy structure, said substrate treatment apparatus further comprising:

a fluid feeder configured to feed a predetermined fluid to said brush body of said cleaning brush with said pair of brush shapers being placed in said target position, and form a flow of said fluid which goes toward said contact portion of said pair of brush shapers through an inside of said brush body.

10. The substrate treatment apparatus according to claim 8, wherein a suction flow path which opens to said contact portion is formed in said pair of brush shapers, said substrate treatment apparatus further comprising:

a decompressor which communicates with said suction flow path and is configured to reduce a pressure in said suction flow path.

11. The substrate treatment apparatus according to claim 8, further comprising:

a correcting-member cleaner configured to feed a cleaning liquid to said contact portion of said pair of brush shapers and clean said contact portion with said pair of brush shapers being at some distance from said target position.

12. The substrate treatment apparatus according to claim 11, wherein said correcting-member cleaner is configured to feed a cleaning liquid to said brush body of said cleaning brush and cleaning said brush body with said pair of brush shapers being placed in said target position.

13. The substrate treatment apparatus according to claim 8, further comprising:

a brush cleaner configured to feed a cleaning liquid to said brush body of said cleaning brush and cleaning said brush body with said pair of brush shapers being placed in said target position.

14. The substrate treatment apparatus according to claim 8, further comprising:

a size measuring device configured to measure an amount of deformation of said brush body of said cleaning brush.

* * * * *